US010818711B2

(12) United States Patent
Fleischman et al.

(10) Patent No.: US 10,818,711 B2
(45) Date of Patent: Oct. 27, 2020

(54) NARROWBAND LIGHT FILTERS

(71) Applicant: California Institute of Technology, Pasadena, CA (US)

(72) Inventors: Dagny Fleischman, Pasadena, CA (US); Harry A. Atwater, South Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 15/961,819

(22) Filed: Apr. 24, 2018

(65) Prior Publication Data
US 2018/0308888 A1 Oct. 25, 2018

Related U.S. Application Data

(60) Provisional application No. 62/488,931, filed on Apr. 24, 2017.

(51) Int. Cl.
*H01L 31/0232* (2014.01)
*H01L 27/146* (2006.01)
(Continued)

(52) U.S. Cl.
CPC ........ *H01L 27/14621* (2013.01); *G02B 5/201* (2013.01); *G02B 5/208* (2013.01);
(Continued)

(58) Field of Classification Search
CPC ......... H01L 27/14621; H01L 27/14685; G03F 7/0007; G02B 5/208; G02B 5/201; G03C 7/12

See application file for complete search history.

(56) References Cited

U.S. PATENT DOCUMENTS

2008/0170143 A1 7/2008 Yoshida
2011/0122344 A1* 5/2011 Matsumuro ....... G02F 1/136286
349/96

(Continued)

FOREIGN PATENT DOCUMENTS

EP 1098210 A2 5/2001
JP 2011191688 A 9/2011
WO 2018200593 A1 11/2018

OTHER PUBLICATIONS

International Search Report and Written Opinion for International Application No. PCT/US2018/029230, Search completed Aug. 29, 2018, dated Aug. 29, 2018, 11 Pgs.

(Continued)

*Primary Examiner* — Ismail A Muse
(74) *Attorney, Agent, or Firm* — KPPB LLP

(57) ABSTRACT

Narrowband light filters, and methods of manufacturing such light filters, are provided. A narrowband light filter may include at least two electrically conductive bodies, an electrically conductive thin film layer disposed between the at least two electrically conductive bodies, at least one protective oxide layer disposed on the thin film layer and electrically conductive bodies, and at least one slit disposed through the electrically conductive thin layer. In various embodiments, the electrically conductive bodies give the narrowband light filter a mirrored structure in exemplary embodiments of the invention. The narrowband filters may also include one or more slits. Multiple slits may be configured to make the narrowband filtration polarization-independent. A plurality of narrowband light filters may be configured into pixel arrays. Pixel arrays may also be used in multispectral or hyperspectral imaging apparatus and techniques.

18 Claims, 44 Drawing Sheets

(51) Int. Cl.
    *G02B 5/20*     (2006.01)
    *G03C 7/12*     (2006.01)
    *G03F 7/00*     (2006.01)

(52) U.S. Cl.
    CPC ............. *G03C 7/12* (2013.01); *G03F 7/0007* (2013.01); *H01L 27/14685* (2013.01)

(56) References Cited

U.S. PATENT DOCUMENTS

| | | | | |
|---|---|---|---|---|
| 2016/0104731 | A1* | 4/2016 | Chow | H01L 27/14634 438/64 |
| 2018/0068920 | A1* | 3/2018 | Leung | H01L 23/3114 |
| 2018/0205866 | A1* | 7/2018 | Komai | G03B 19/16 |
| 2018/0261555 | A1* | 9/2018 | Cho | H01L 23/585 |

OTHER PUBLICATIONS

Abramson et al., "The NOMAD project", Aug. 2016, https://www.gerad.ca/nomad/, 2017, 2 pgs.

Balram et al., "Self-aligned Silicon Fins in Metallic Slits as a Platform for Planar Wavelength-Selective Nanoscale Resonant Photodetectors", Optics Express, Sep. 19, 2012, vol. 20, No. 20, pp. 22735-22742, See pp. 22736-22741.

Barton et al., "All-Dielectric Frequency Selective Surfaces with Few Number of Periods", Progress in Electromagnetics Research vol. B, 2012, vol. 41, pp. 269-283.

Burgos et al., "Color Imaging via Nearest Neighbor Hole Coupling in Plasmonic Color Filters Integrated onto a Complementary Metal-Oxide Semiconductor Image Sensor", ACS Nano, Oct. 24, 2013, vol. 7, No. 11, pp. 10038-10047.

Chen et al., "Nanophotonic Image Sensors", Small, May 30, 2016, 12, No. 36, pp. 4922-4935.

Fleischman et al., "Hyper-selective plasmonic color filters", Optics Express, Oct. 30, 2017, vol. 25, No. 22, pp. 27386-27395.

Jang et al., "Experimental Demonstration of Adaptive Infrared Multispectral Imaging using Plasmonic Filter Array", Scientific Reports, Oct. 10, 2016, 6:34876, 9 pgs.

Le Digabel, "Algorithm 909: NOMAD: Nonlinear Optimization with the MADS Algorithm", ACM Transactions on Mathematical Software, Feb. 2011, vol. 37, No. 4, 1-44:15.

Li et al., "Large-Area, Lithography-Free Super Absorbers and Color Filters at Visible Frequencies Using Ultrathin Metallic Films", ACS Photonics, Jan. 28, 2015, vol. 2, pp. 183-188.

Liu et al., "Adjustable Plasmon Resonances through an H-shaped Metallic Grating", Optics Communications, vol. 285, No. 18, pp. 3781-3786, Jun. 2, 2012 See pp. 3781-3785.

Mazulquim et al., "Efficient band-pass color filters enabled by resonant modes and plasmons near the Rayleigh anomaly", Optics Express, Dec. 4, 2014, vol. 22, No. 25, pp. 30843-30851.

Xu et al., "Plasmonic nanoresonators for high-resolution colour filtering and spectral imaging", Nature Communications, Aug. 24, 2010, 1:59, 5 pgs.

International Preliminary Report on Patentability for International Application PCT/US2018/029230, Report dated Oct. 29, 2019, dated Nov. 7, 2019, 9 pgs.

\* cited by examiner 100s of nm

FIG. 3A
FIG. 3B
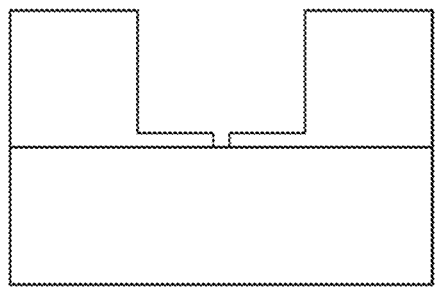
Mirrored
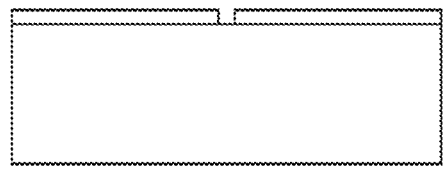
Non-Mirrored
Prior Art
FIG. 3C
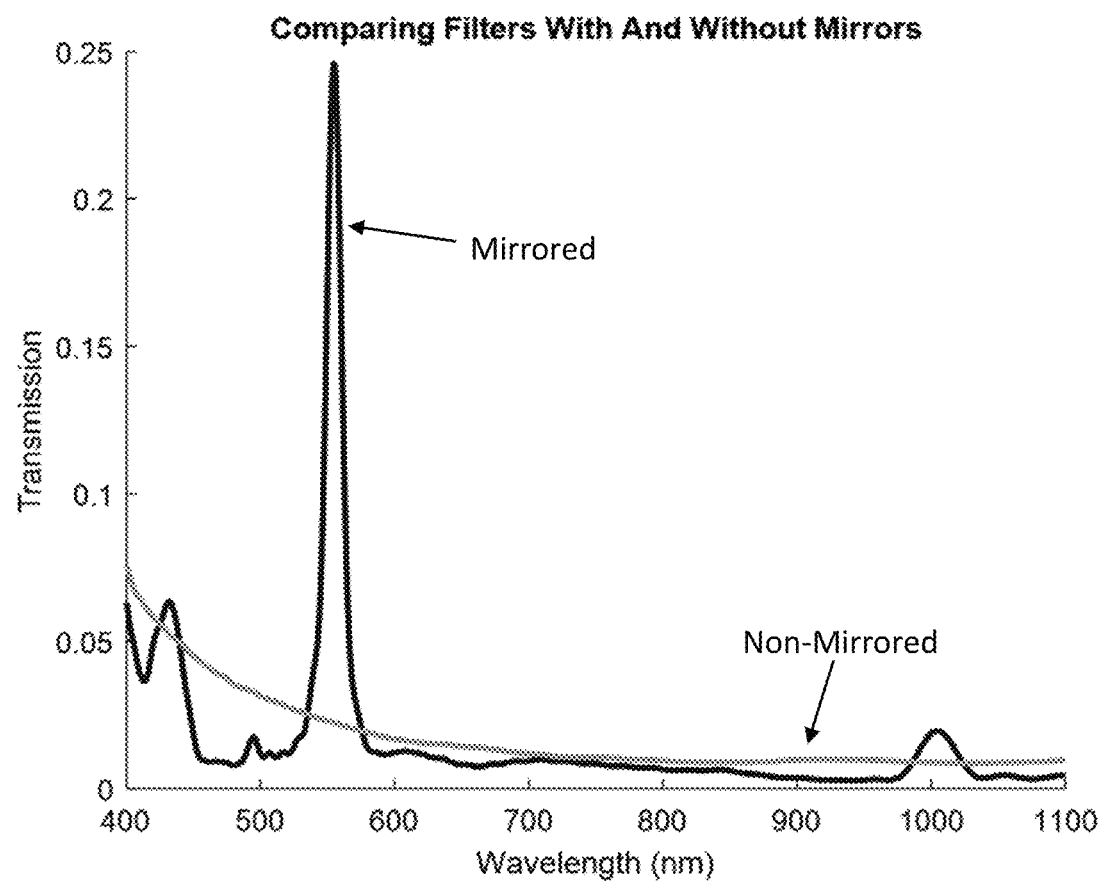

Polarization-Dependent

Polarization-Independent

PRIOR ART

Small Superpixel

Lower Spectral Resolution Superpixel Array

Higher Spectral Resolution Superpixel Array

PRIOR ART

Before Squishing

RMS roughness: 5.58 nm

After Squishing

RMS roughness: 0.55 nm

- Before ALD

- After ALD

NARROWBAND LIGHT FILTERS

CROSS-REFERENCE TO RELATED APPLICATIONS

The current application claims priority to U.S. Provisional Patent Application No. 62/488,931, filed Apr. 24, 2017, the disclosure of which is incorporated herein by reference.

FIELD OF THE INVENTION

The present disclosure relates generally to nanophotonic structures, and more specifically to narrowband light filters, their methods of manufacture, and applications thereof.

BACKGROUND OF THE INVENTION

Today's state-of-the art mobile electronics are as powerful as larger computers, and are equipped with a variety of sensors including accelerometers, gyroscopes, CMOS image sensors, and magnetometers. CMOS image sensors have a particularly broad landscape of potential new function: optical data on mobile platforms today consists primarily of three-color imaging, but a wide variety of applications could be accessed by the collection of high-resolution spectroscopic information.

Plasmonic structures have been demonstrated as a color filter platform well suited for CMOS integration due to the small mode volumes of plasmons and the CMOS compatibility of many of the materials that support them. Plasmonic hole array filters, for example, have been demonstrated as a viable alternative to dye-based filters for RGB and CMYK color filtering.

SUMMARY OF THE INVENTION

The present disclosure provides, in accordance with the current invention, embodiments directed to narrowband light filters and their methods of manufacture.

Many embodiments of the invention are directed to narrowband light filters, including:
  at least two electrically conductive bodies having a first thickness;
  an electrically conductive thin film layer disposed between the at least two electrically conductive bodies, the electrically conductive thin film layer having a second thickness wherein the second thickness is less than the first thickness;
  at least one slit disposed through the electrically conductive thin layer;
  wherein the electrically conductive thin film layer and electrically conductive bodies are disposed between first and second layers of dielectric material; and
  wherein the electrically conductive bodies and slit are configured in a relative geometry such that a resonance is created in electromagnetic radiation incident thereon such that only electromagnetic radiation of a specific spectral band is passed through the at least one slit.

In other embodiments the electrically conductive thin film layer and electrically conductive bodies are formed from the same or a different metal.

In still other embodiments, the narrowband light filter further includes at least one protective oxide layer disposed on at least a surface of the electrically conductive thin film layer and electrically conductive bodies exposed to the incident electromagnetic radiation.

In yet other embodiments the at least one protective oxide layer is formed of $HfO_2$ having a thickness of 10 nm or less.

In still yet other embodiments, the dielectric material is $SiO_2$.

In still yet other embodiments, the incident electromagnetic radiation is selected from the group consisting of microwave, infrared, and visible light.

In still yet other embodiments the electromagnetic radiation is visible light, the dielectric material is $SiO_2$, the at least one protective oxide layer is formed of $HfO_2$, and wherein the electrically conductive thin film layer and electrically conductive bodies are formed of silver.

In still yet other embodiments, the filter comprises a plurality of slits disposed perpendicular to each other such that the narrowband color filter is independent of the polarization of the beam of incident electromagnetic radiation.

In still yet other embodiments, the first thickness is at least 100 nm.

In still yet other embodiments, the second thickness is between 40 nm and 60 nm.

In still yet other embodiments the at least two electrically conductive bodies are separated by a distance of from 160 to 600 nm.

In still yet other embodiments, the slit has an opening width of from 10 to 70 nm.

In still yet other embodiments, the narrowband light filter has an area of 5 $\mu m^2$ or less.

In still yet other embodiments, the narrowband light filter has an area of 1 $\mu m^2$ or less.

Many other embodiments of the invention are directed to an image sensor including:
  an array of narrowband light filters, each comprising:
    at least two electrically conductive bodies having a first thickness;
    an electrically conductive thin film layer disposed between the at least two electrically conductive bodies, the electrically conductive thin film layer having a second thickness wherein the second thickness is less than the first thickness;
    at least one slit disposed through the electrically conductive thin layer;
    wherein the electrically conductive thin film layer and electrically conductive bodies are disposed between first and second layers of dielectric material; and
    wherein the electrically conductive bodies and slit are configured in a relative geometry such that a resonance is created in electromagnetic radiation incident thereon such that only electromagnetic radiation of a specific spectral band is passed through the at least one slit; and
  wherein each of the narrowband light filters are separated by a distance of at least 50 nm.

In other embodiments, each array is associated with a pixel of the image sensor.

In yet other embodiments, the pixel is incorporated into a complementary metal-oxide-semiconductor (CMOS) image sensor.

In still other embodiments, the image sensor comprises a plurality of pixels each composed of several spectral bands to form a hyperspectral imaging sensor.

Still many other embodiments are directed to methods of fabricating a narrowband light filter including:
  preparing a substrate formed of a dielectric material;
  depositing a resist material onto the substrate and patterning the resist material such that regions corresponding to at least two holes and a raised region disposed therebetween are mapped onto the substrate;

depositing a mask onto the resist material and substrate, wherein at least a first portion of the mask is disposed directly onto the substrate, and wherein the first portion corresponds to the raised region;

removing the resist material and etching the substrate, where at least a portion of the substrate is protected by the mask from the etching, and wherein the protected portion corresponds to the raised region and the etched portion corresponds to the at least two holes;

removing the mask and depositing a protective oxide layer onto the substrate;

depositing an electrically conductive layer atop the substrate such that the at least two holes are filled to form at least two electrically conductive bodies, and wherein the raised region forms an electrically conductive thin film layer disposed therebetween;

pressing and thinning the at least one electrically conductive layer to reduce the thickness of at least the thin film layer;

forming at least one slit through the thin film layer to expose a portion of the substrate; and depositing an additional layer of the dielectric material onto the exposed substrate and thinned electrically conductive layer such that the electrically conductive thin film and electrically conductive bodies are disposed between the substrate and additional layer of the dielectric material; and wherein the electrically conductive bodies and slit are configured in a relative geometry such that a resonance is created in electromagnetic radiation incident thereon such that only electromagnetic radiation of a specific spectral band is passed through the at least one slit.

Yet many other embodiments are directed to methods of fabricating a narrowband light filter including:

preparing a substrate formed of a dielectric material;

depositing an electrically conductive thin film onto the substrate;

depositing a resist material onto the electrically conductive thin film and patterning the resist material such that at least two regions of the electrically conductive thin film corresponding are exposed having a protected region disposed therebetween;

depositing an electrically conductive material within the at least exposed regions of the electrically conductive thin film to form at least two electrically conductive bodies having a region of electrically conductive thin film disposed therebetween;

removing the resist material;

depositing a protective oxide layer onto the electrically conductive thin film and at least two electrically conductive bodies;

forming at least one slit through the region of electrically conductive thin film such that a portion of the substrate is exposed;

depositing an additional layer of dielectric material atop the exposed substrate, electrically conductive thin film, and at least two electrically conductive bodies; and wherein the electrically conductive bodies and slit are configured in a relative geometry such that a resonance is created in electromagnetic radiation incident thereon such that only electromagnetic radiation of a specific spectral band is passed through the at least one slit.

Additional embodiments and features are set forth in part in the description that follows, and in part will become apparent to those skilled in the art upon examination of the specification or may be learned by the practice of the disclosed subject matter. A further understanding of the nature and advantages of the present disclosure may be realized by reference to the remaining portions of the specification and the drawings, which form a part of this disclosure.

BRIEF DESCRIPTION OF THE DRAWINGS

These and other features and advantages of the present apparatus and methods will be better understood by reference to the following detailed description when considered in conjunction with the accompanying data and figures, which are presented as exemplary embodiments of the disclosure and should not be construed as a complete recitation of the scope of the invention, wherein:

FIG. 3A provides a schematic of a mirrored slit narrowband filter according to embodiments.

FIG. 3B provides a schematic of a non-mirrored slit narrowband filter.

FIG. 3C provides a data plot comparing transmission of mirrored and non-mirrored slit narrowband filters.

FIGS. 15A to 15C provide schematics of 2D and 3D slit narrowband filters according to embodiments.

DETAILED DESCRIPTION OF THE INVENTION

Figure 1:
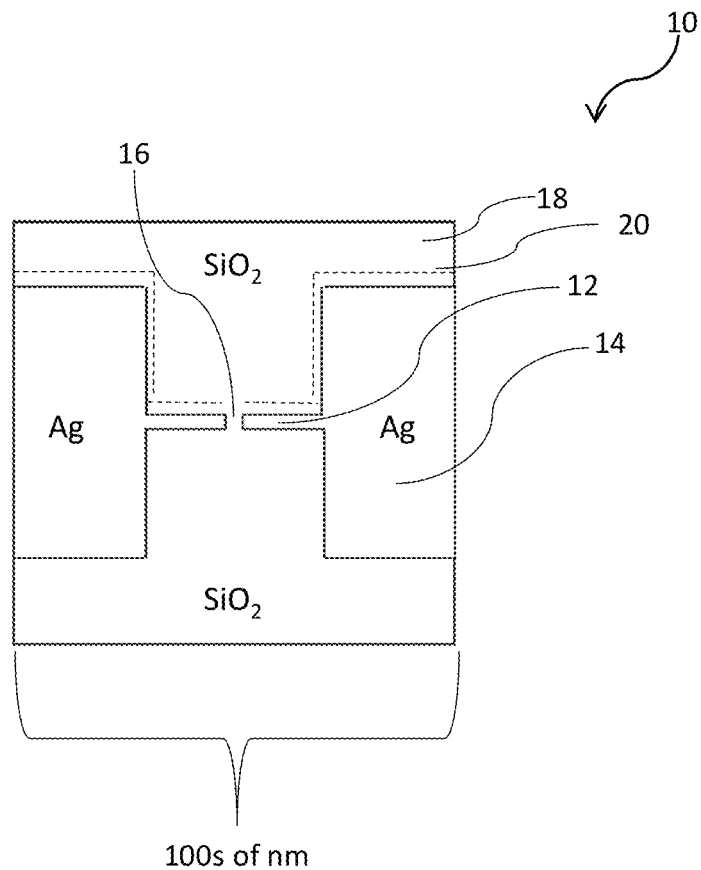
FIG. 1 provides a schematic of a single slit narrowband filter according to embodiments.

The embodiments of the inventive methods and apparatus described herein are not intended to be exhaustive or to limit the inventive methods and apparatus to precise forms disclosed. Rather, the embodiments selected for description have been chosen to enable one skilled in the art to practice the invention.

Turning now to the drawings, narrowband light filters, and methods of manufacturing such light filters, are provided. In many embodiments of the invention, as a narrowband light filter comprises at least two electrically conductive bodies, an electrically conductive thin film layer disposed between the at least two electrically conductive bodies, at least one optional protective oxide layer disposed on the electrically conductive thin film layer and bodies, and at least one slit disposed through the electrically conductive thin layer. In various embodiments, the electrically conductive bodies give the narrowband light filter a mirrored structure in exemplary embodiments of the invention. In various embodiments, the electrically conductive bodies and thin film layer are formed of an electrically conductive material. In many embodiments the narrowband filters may include one or more slits. In various embodiments where multiple slits are used the slits may be configured to make the narrowband filtration polarization-independent. Regardless of the specific number and size, embodiments incorporate arrangements of electrically conductive bodies, thin film layers and slits such that a resonance is created in electromagnetic radiation incident thereon such that only electromagnetic radiation of a specific spectral band is passed through the at least one slit. Some embodiments are also directed to the arrangement of a plurality of such narrowband light filters into pixel arrays. In many such embodiments pixel arrays may be used in multispectral or hyperspectral imaging apparatus and techniques.

Color and spectral imaging systems often use filters or prisms to disperse light of different wavelengths. Conventionally plasmonic hole and slit array color filters have been used to filter the visible spectrum into spectral bands. By reducing the transmission bandwidth of filters to less than 30 nm it would be possible to gain the ability to perform multi and hyper-spectral imaging without requiring post-processing, which can slow image acquisition. (See, e.g., Q. Chen, et al., Small 12(36), 4922-4935 (2016), the disclosure of which is incorporated herein by reference.) Narrow bandwidth responses have been reported in thin-filmed multilayer plasmonic structures. However, the peak wavelength of these structures is tuned via changing the thickness of the intermediate dielectric layer, so the many lithographic steps needed to patterns the tens to hundreds of spectral bands make these structures infeasible for many applications, including multi- and hyper-spectral filtering. GMR filters also provide narrowband transmission. However, GMR filters require medium to long range order and thus required a footprint far too large to incorporate into small pixel devices. (See, e.g., D. B. Mazulquim, et al., Opt. Express 22(25), 30843-30851 (2014); and Z. Li, S. Butun, and K. Aydin, ACS Photonics 2, 183-188 (2015), the disclosures of which are incorporated herein by reference)

Embodiments of Narrowband Filters

Figure 2:
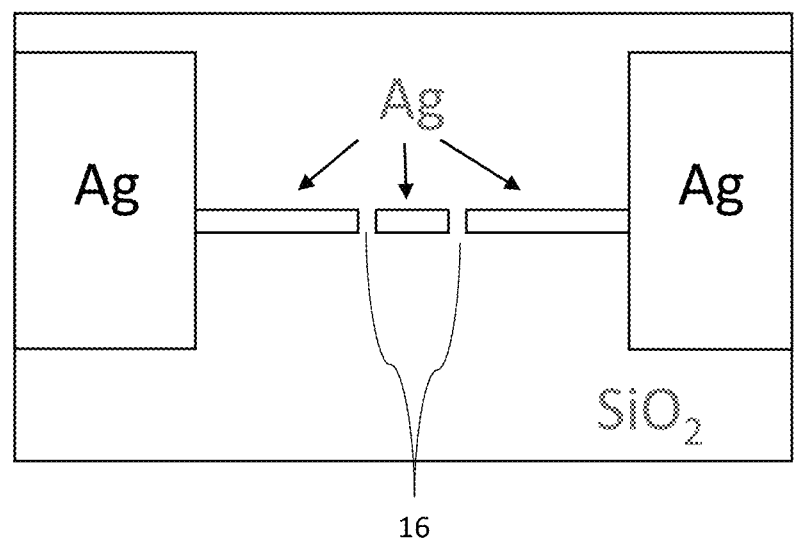
FIG. 2 provides a schematic of a multiple slit narrowband filter according to embodiments.

Embodiments are now directed to mirrored thin-film narrowband filters capable of achieve high spectral resolution across the entire electromagnetic spectrum at scales (on the order of 100 s of nms) capable of integration with CMOS devices. FIGS. 1 and 2 provide schematics of narrowband filters in accordance with many embodiments. As shown, the filters (10) general comprise an electrically conductive thin film (12) disposed between two electrically conductive bodies (14) having walls that extend above the plane of the thin film and configured to act as a mirrored structure and reflect incoming light therebetween and onto the thin film. At least one slit (16), or as shown in FIG. 2 a plurality of slits, are formed in the thin film creating a light passage therethrough. In many embodiments the bodies and thin film may be formed of an electrically conductive material, such as, for example, a metal. Exemplary metals usable in such filters include, for example, Ag, Au, Cu, etc. In embodiments, the metal may be chosen based on the spectral band of light to be selectively transmitted by the filter. For example, at visible wavelengths Ag is a viable metal, whereas at longer wavelength more suitable metals may include Au, Cu, Al, etc. The electrically conductive bodies and thin film are disposed within a dielectric material (18), such as, for example, $SiO_2$. An optional protective oxide layer (20) may also be formed atop (e.g., on light incident side of the filter) of one or both the thin film and mirrored bodies to provide an oxidizing/diffusion barrier. Although many oxides may be used, in various embodiments the protective oxide layer is formed of $HfO_2$.

Although specific materials and geometries are provided, it will be understood that various materials and alterations to the overall design may be implemented. For example, although the mirror bodies are shown as extending above and below the plane of the thin film, it will be understood that then mirrored bodies may be constrained such that they extend only above the surface of the thin film onto which an incoming beam of light is to be directed. Moreover, although specific dimensional limits are shown in the figures and provided in this discussion, it will be understood that these dimensions, including the size of the filter and slit, may be varied depending on the application. For example, narrowband filters used for longer wavelength applications, such as, for example, infrared or microwaves may require the dimensions of the elements (such as, for example, slits, mirror heights, etc.) to be scaled accordingly. These dimensions will be derivable by those skilled in the art using, for example, Rayleigh scaling factors.

Figure 4A:
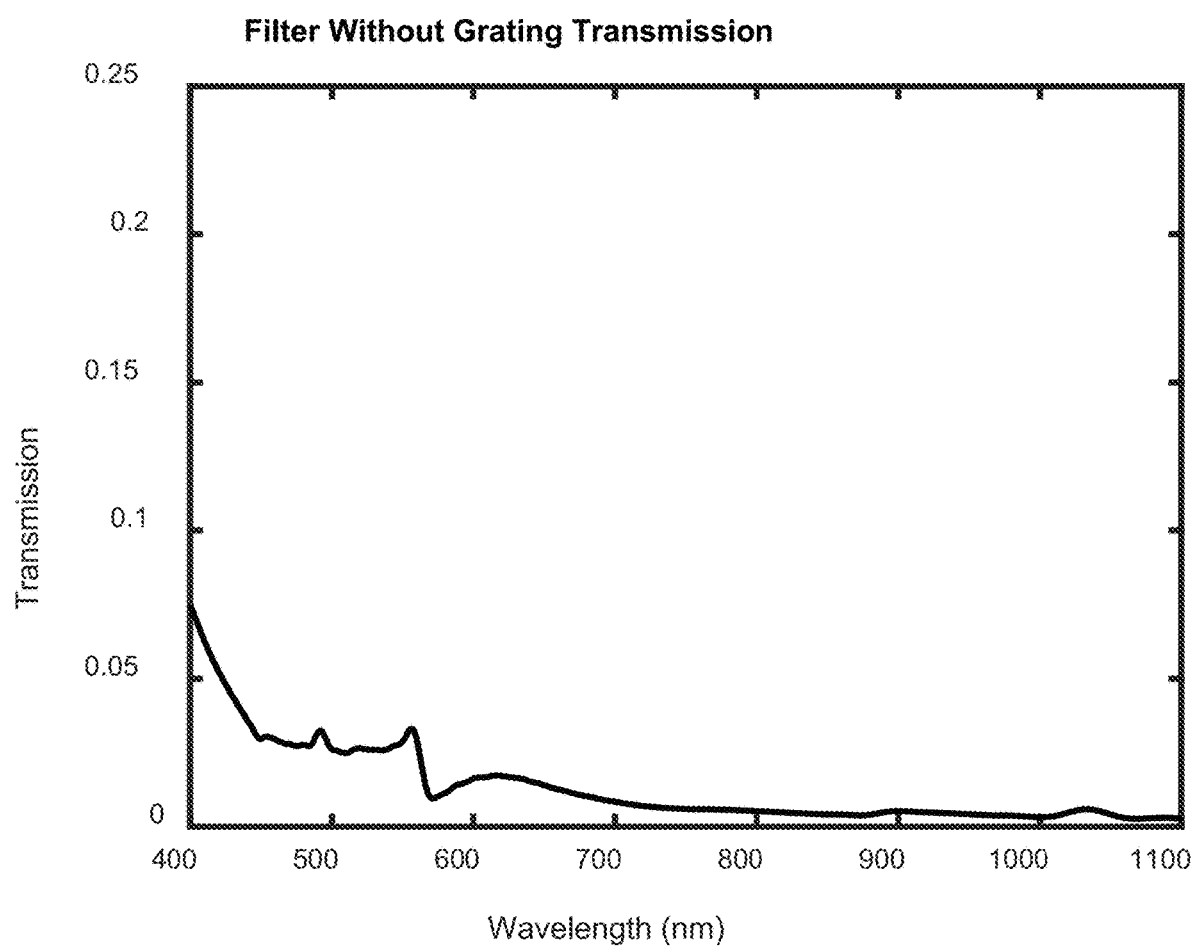
FIGS. 4A to 4C provide data plots comparing transmission and reflection values for (4A) a filter without grating transmission, (4B) a grating transmission, and (4C) a slit filter according to embodiments.
Figure 4B:
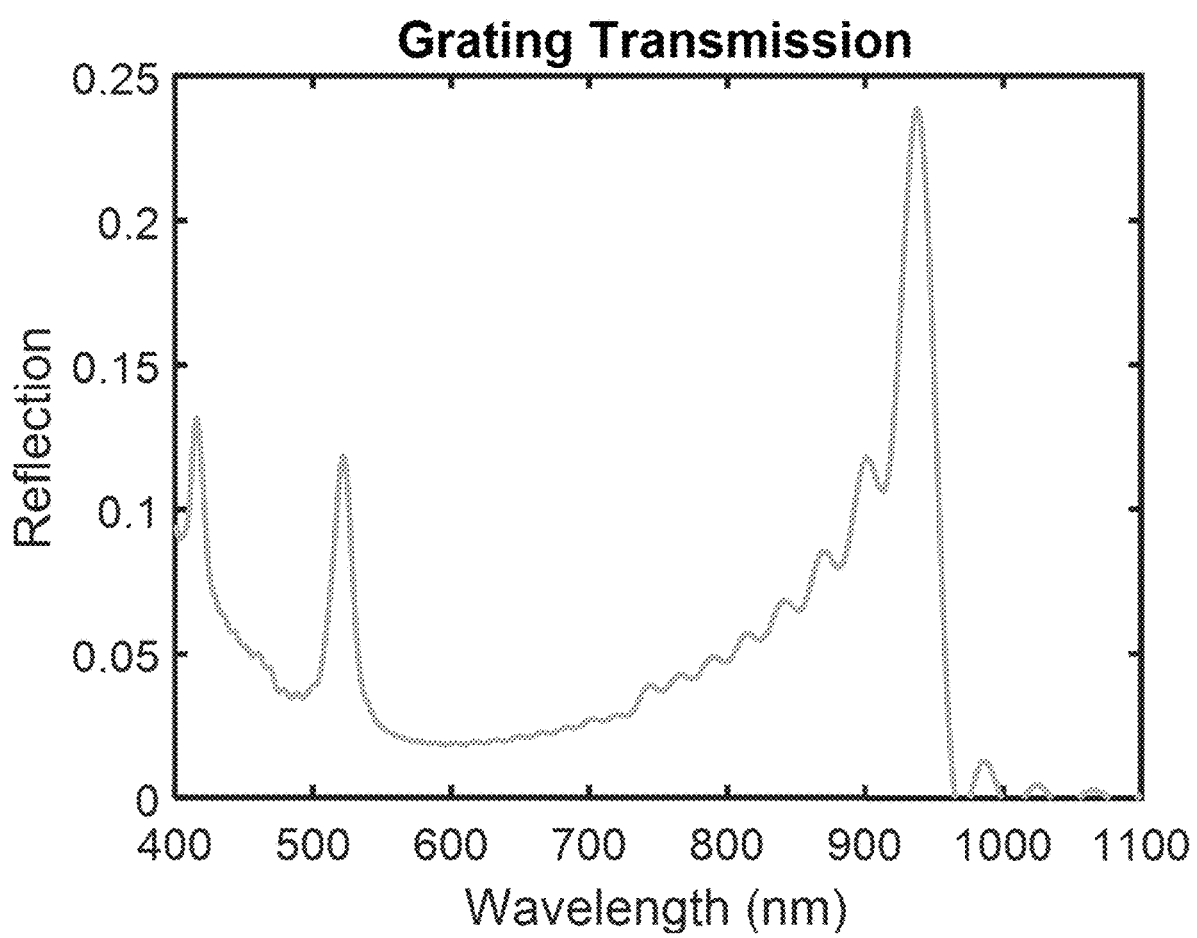
Figure 4C:
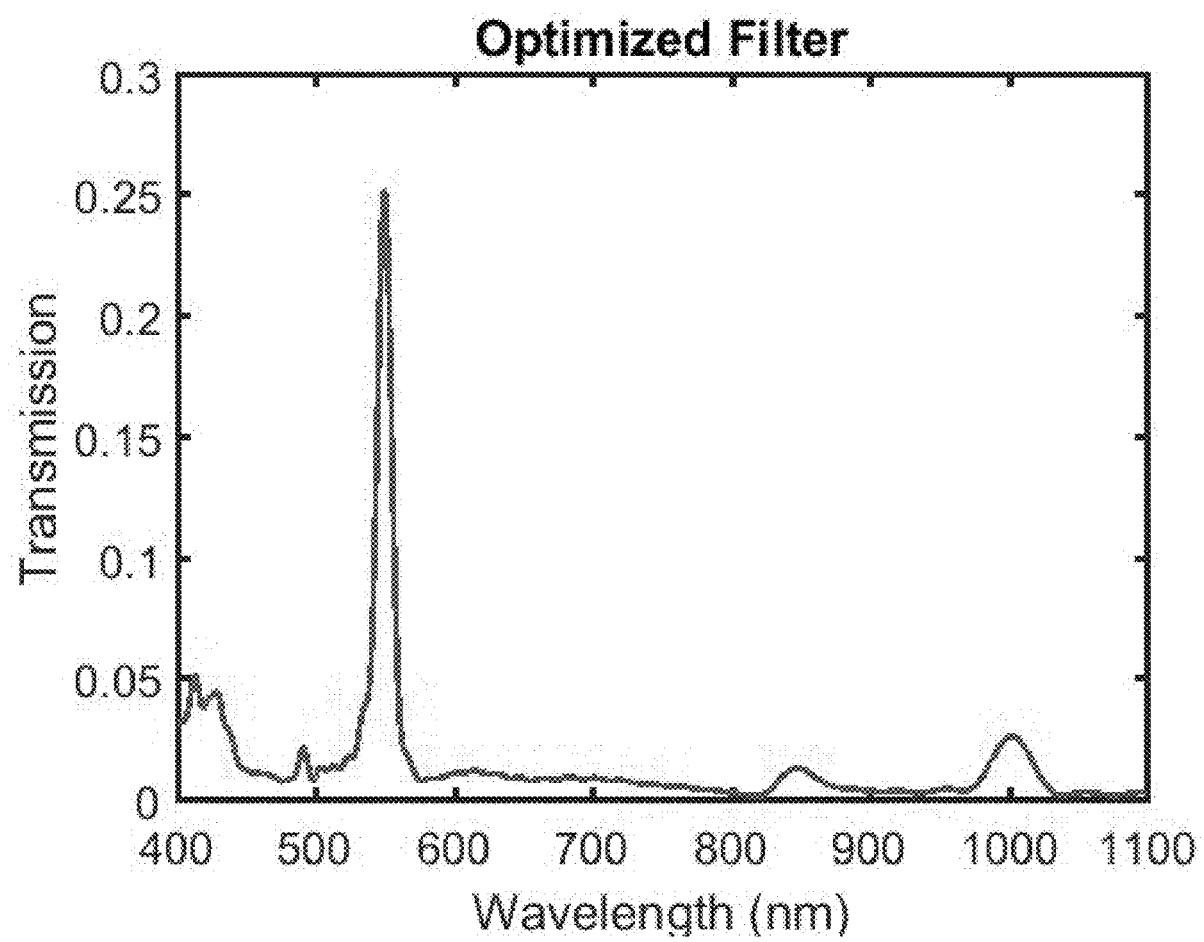

Using embodiments of the narrowband filter it is possible to obtain better filtering performance, with transmission efficiencies of at least 0.2 to 0.3, in a reduced footprint (e.g., at size scales less than 1 µm$^2$). Specifically, the mirrored narrowband filters take advantage of periodic/Bloch boundary conditions and capitalize on reflecting plasmons/confined modes to obtain narrowband filter transmission in a small footprint. Specifically, the interacting resonances in the incoming light created by the combination of the mirrored electrically conductive bodies and the slits disposed in the thin electrically conductive layer operate in a manner comparable to the interferences previous obtained only by use of highly complex multilayer film filters. As shown by the comparison provided in FIGS. 3A and 3B, the mirrored filter structure according to embodiments provides dramatically improved transmission selectivity over non-mirrored slit filters (such as the one shown schematically in FIG. 3B). Moreover, as shown in the comparison graphs provided in FIGS. 4A to 4C, the narrowband filter according to embodiments (4C) shows improved transmission selectivity over both traditional gratings (4B), which shows multiple peaks and a larger footprint, as well as other mirrored filter designs without a grating transmission, which show only a slight resonant feature at the target peak wavelength.

Figure 5:
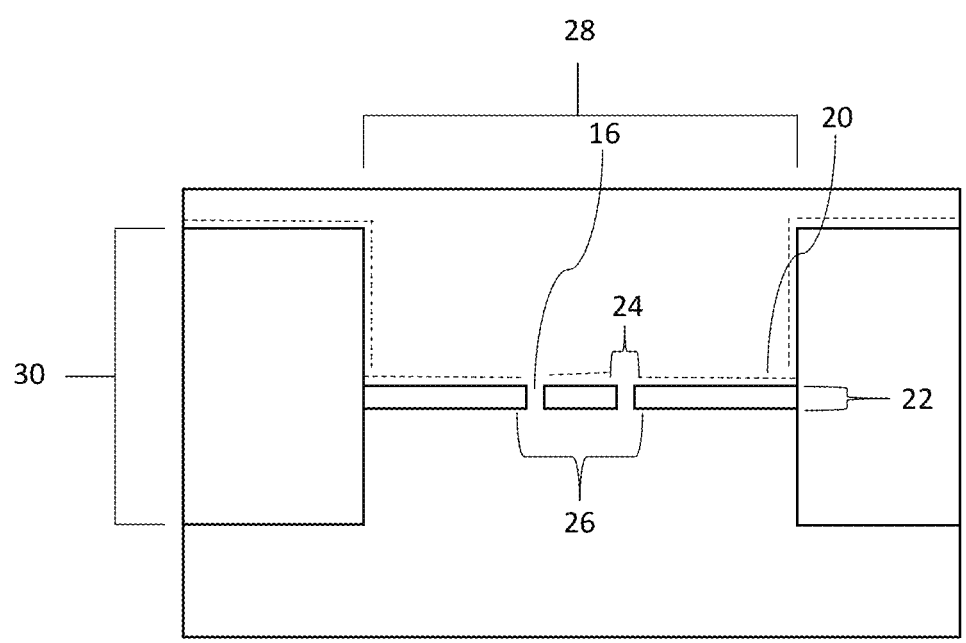
FIG. 5 provides a schematic of a multiple slit narrowband filter according to embodiments.

In accordance with many other embodiments of the invention, certain structural parameters of the narrowband light filter may be varied to optimize performance. For example, as shown schematically in FIG. 5, in many exemplary embodiments, highly coupled parameters such as the electrically conductive thin film layer thickness (22), number of slits (16), slit width (24), separation of slits (26), spacing of the electrically conductive bodies (28), thickness of the electrically conductive bodies (30), and the presence or absence of a protective oxide (20) (and its thickness) may be adjusted to satisfy a specific narrow bandpass transmission standard. The standard may vary depending on the application, and individual parameters or combinations of different parameters may be included in the adjustment.

Figure 6:
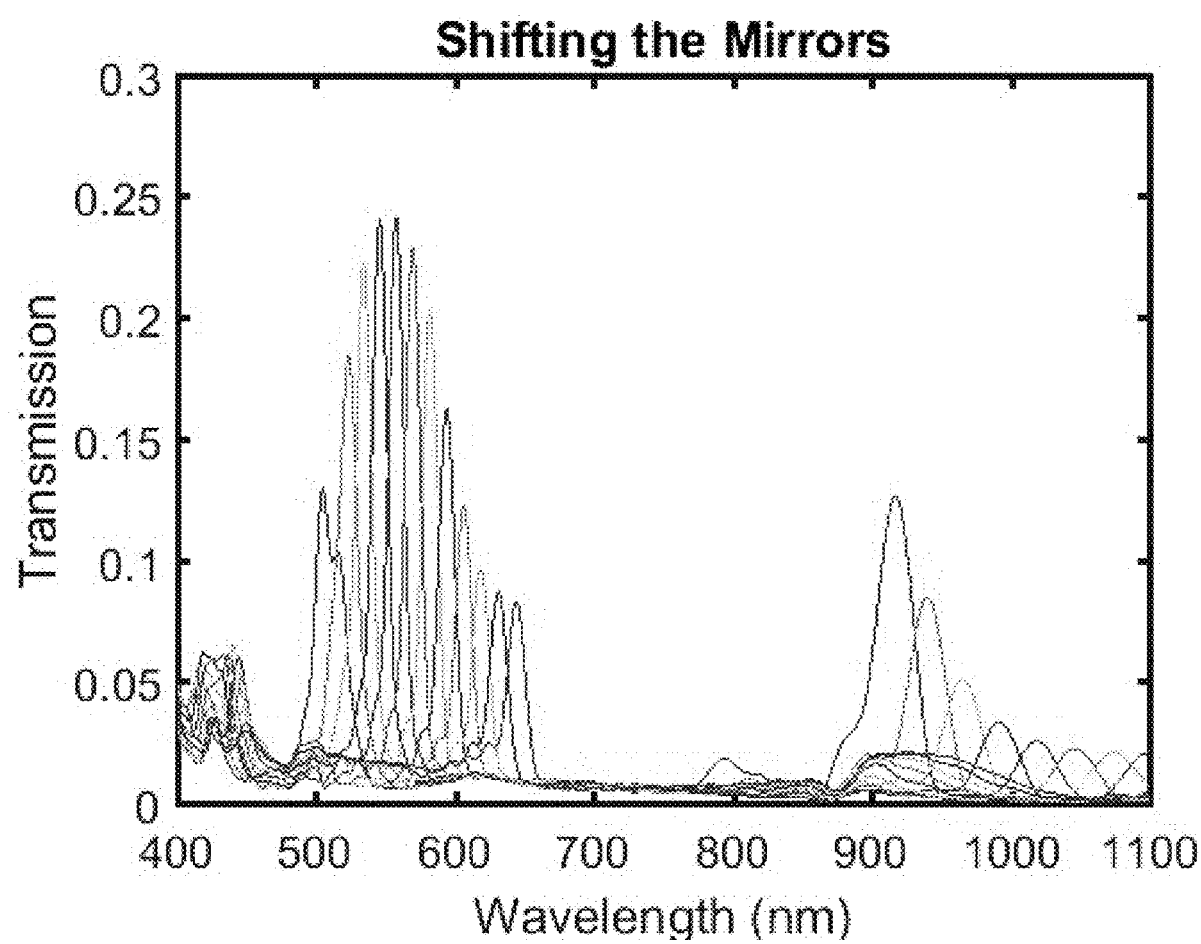
FIG. 6 provides a data plot showing the wavelength selectivity of slit narrowband filters according to embodiments.
Figure 7A:
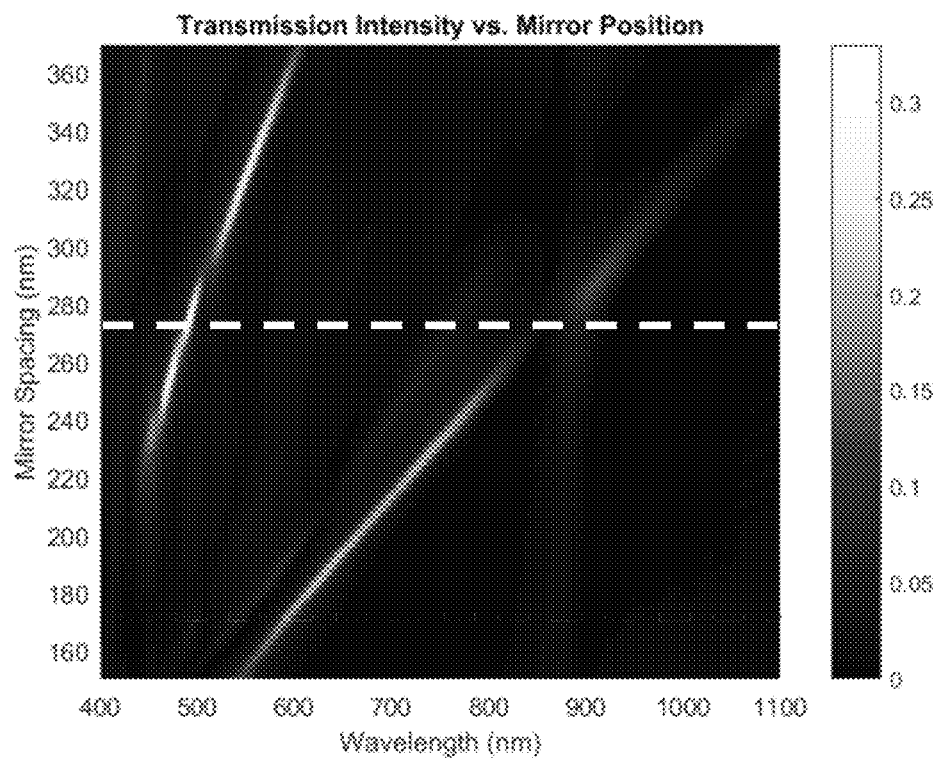
FIGS. 7A to 7F provide data results and plots showing the wavelength selectivity of slit narrowband filters according to embodiments.
Figure 7A:
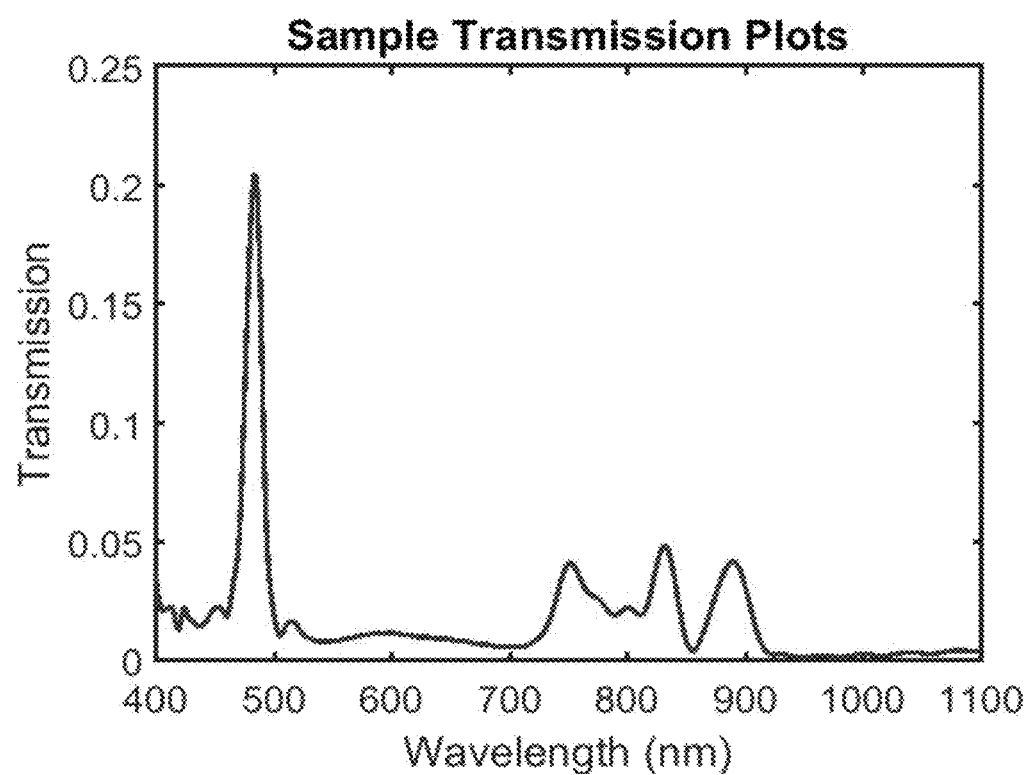
Figure 7B:
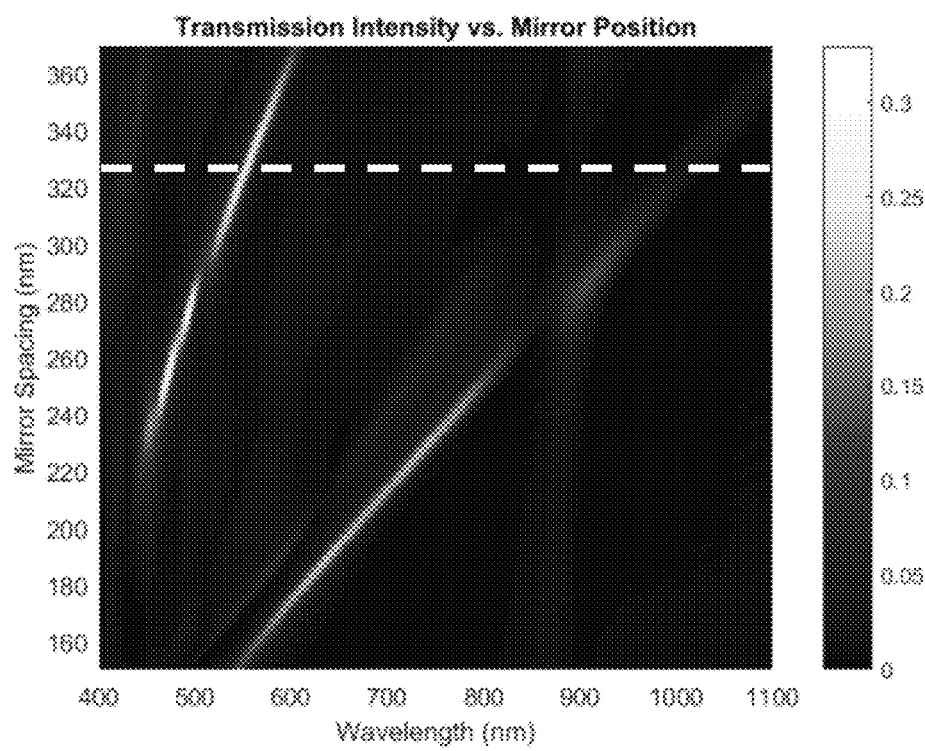
Figure 7B:
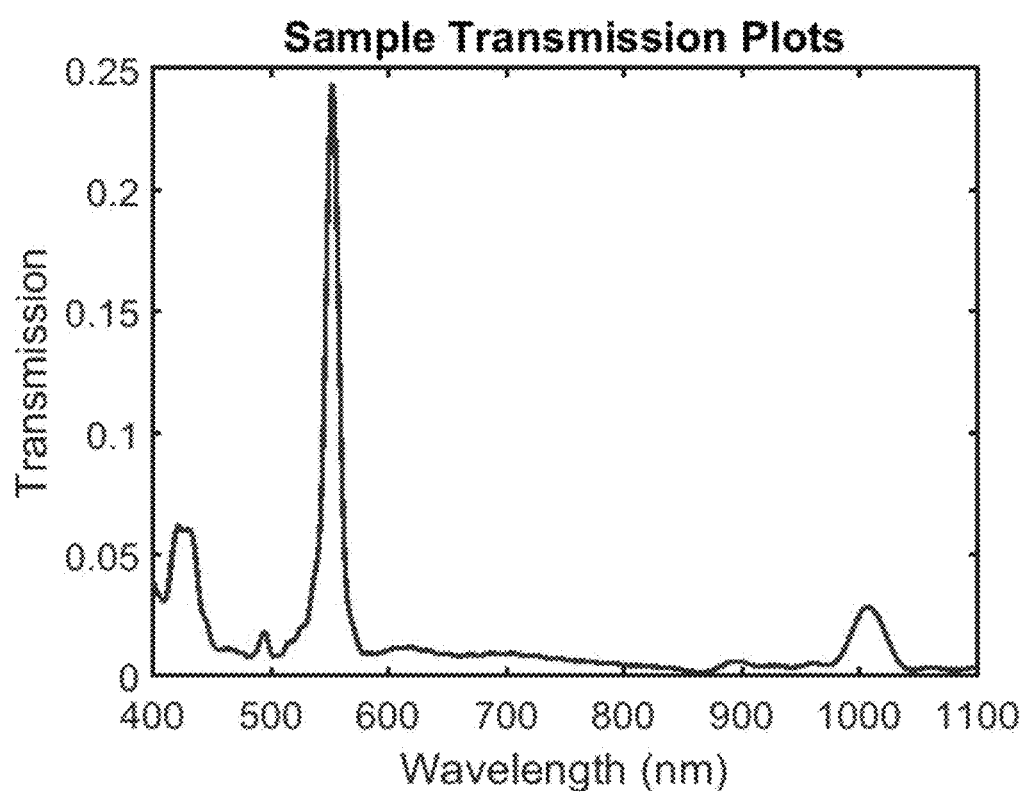
Figure 7C:
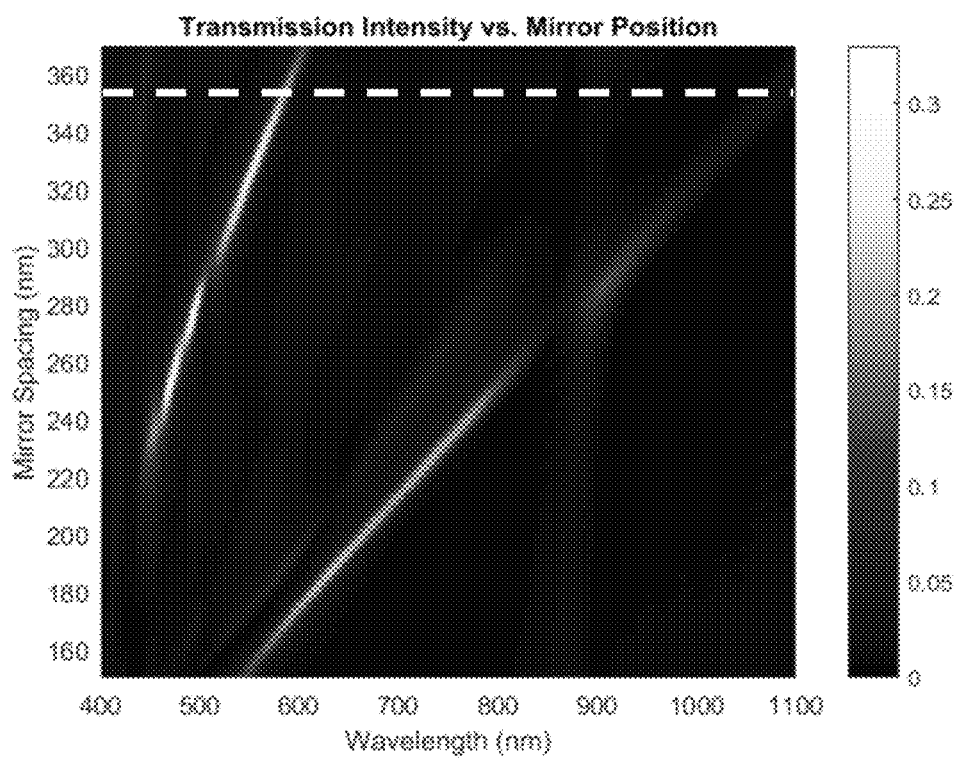
Figure 7C:
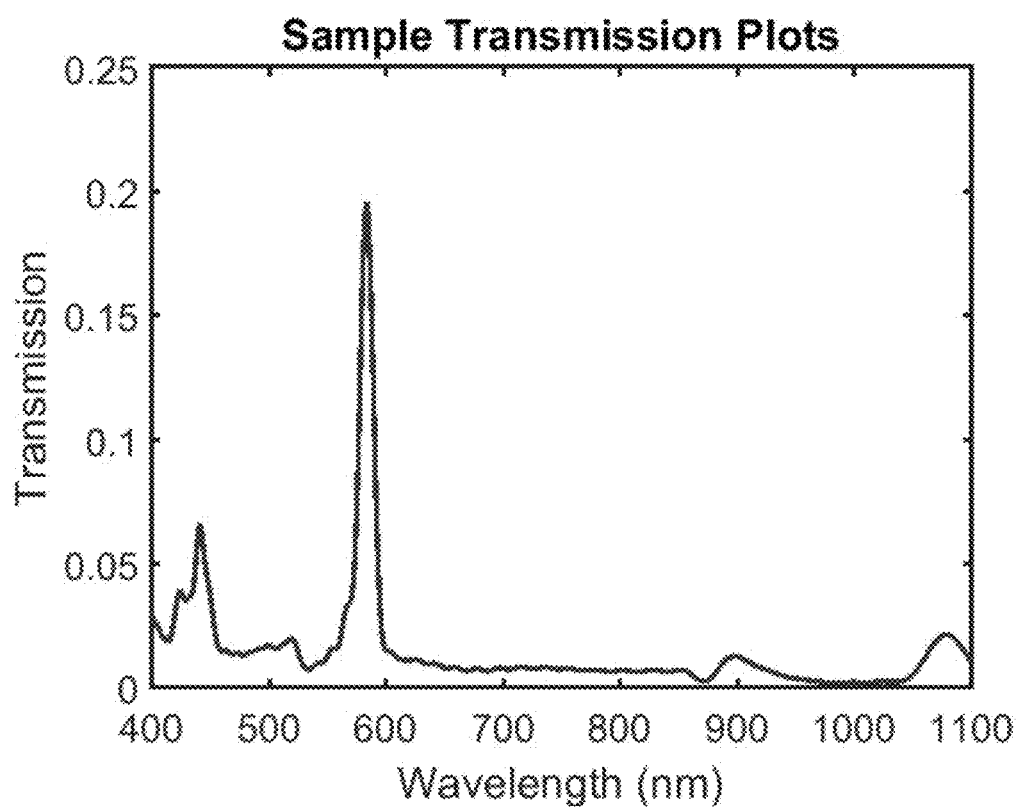
Figure 7D:
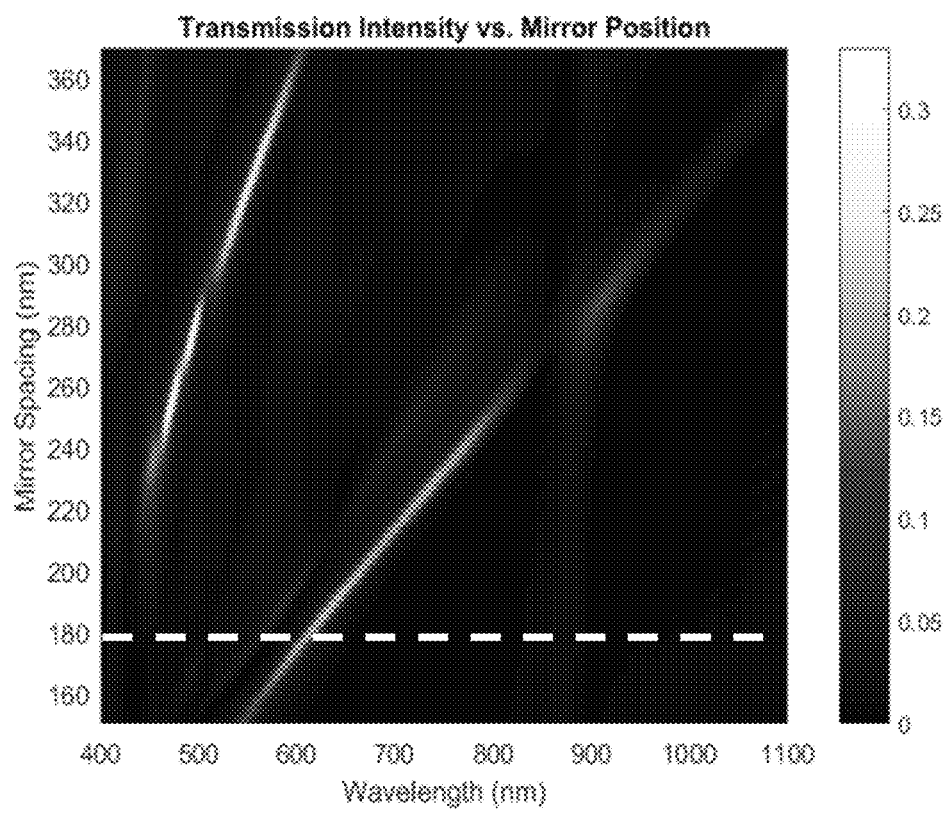
Figure 7D:
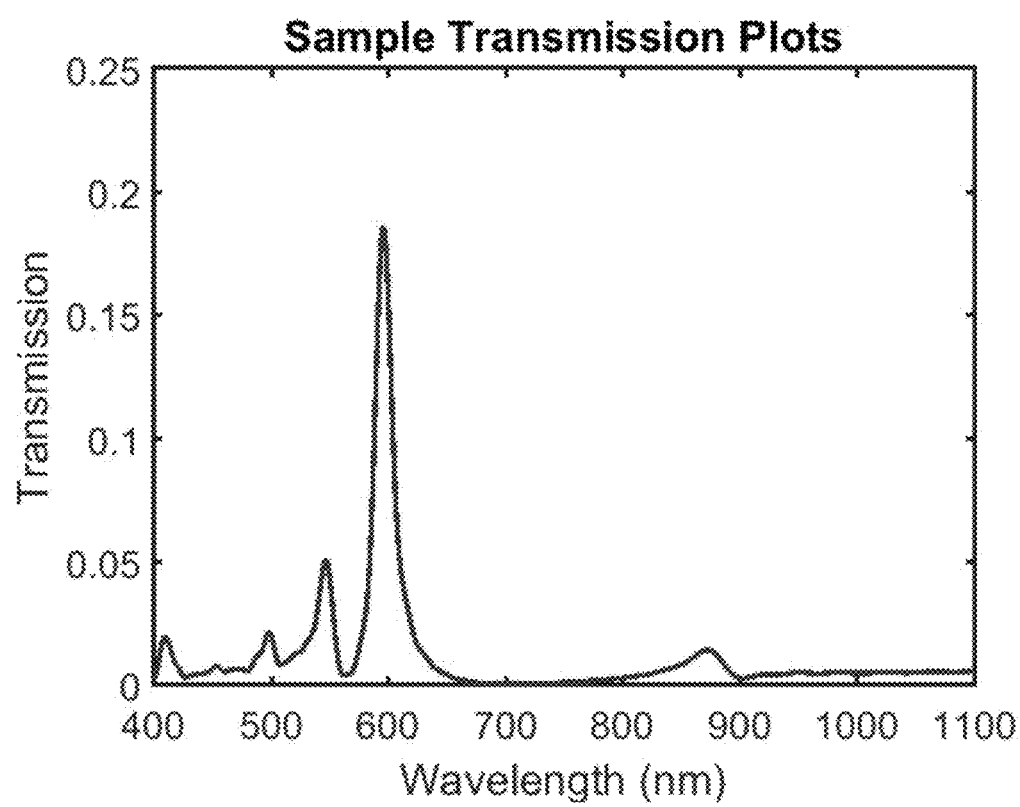
Figure 7E:
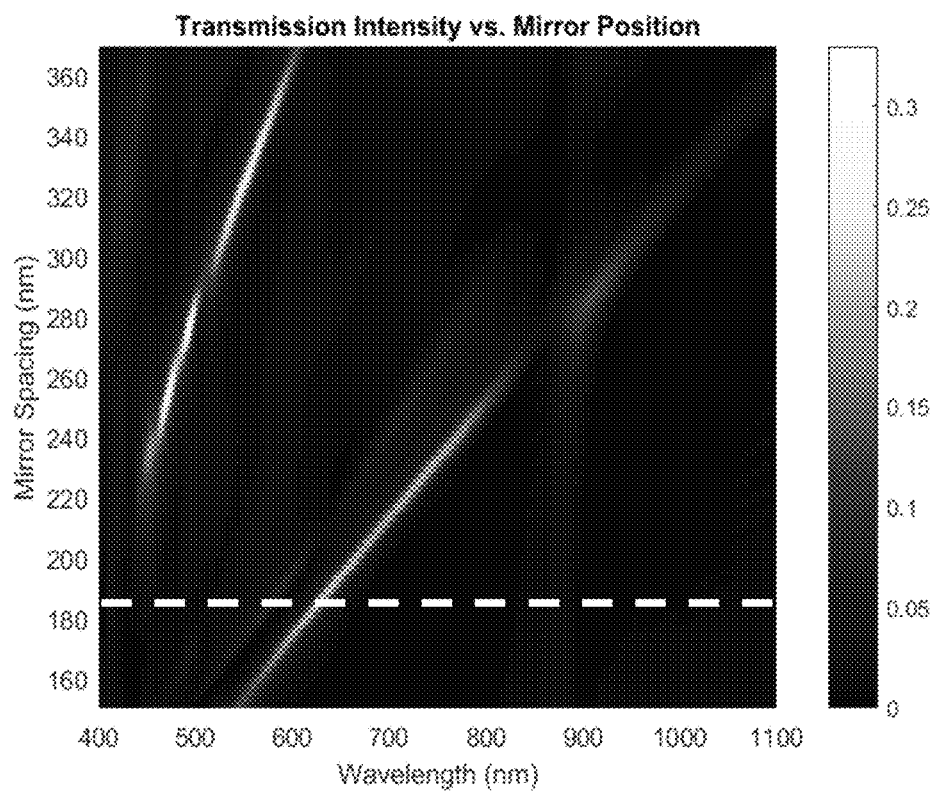
Figure 7E:
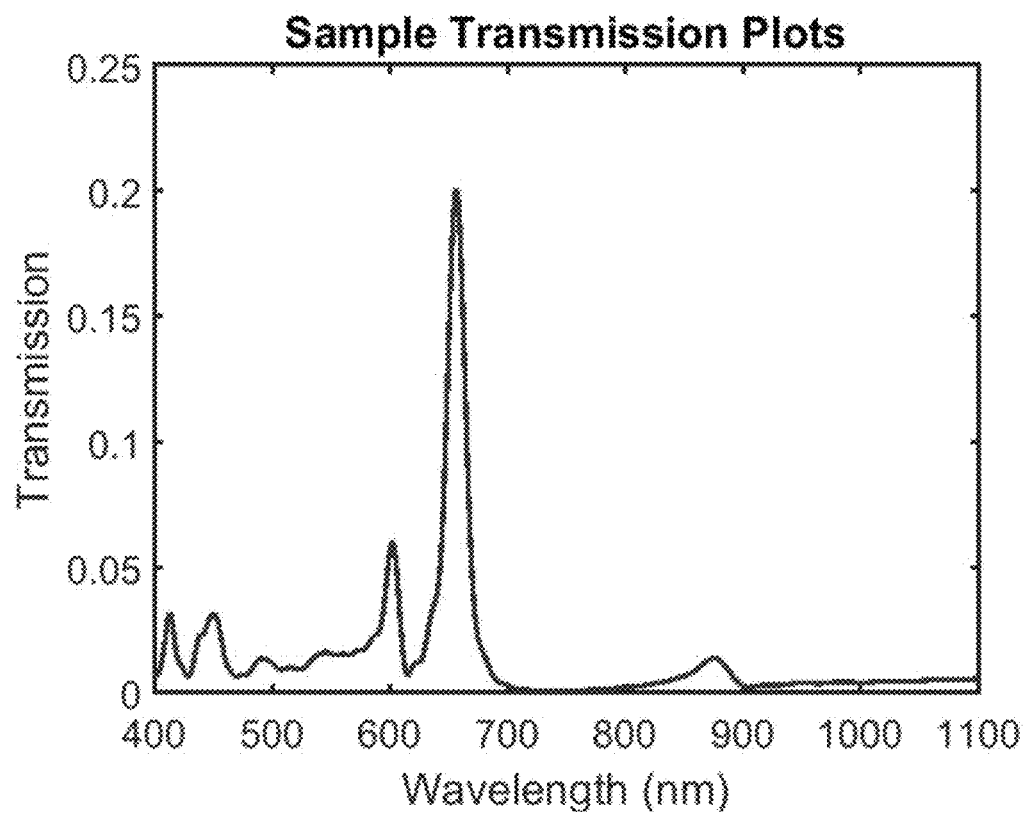
Figure 7F:
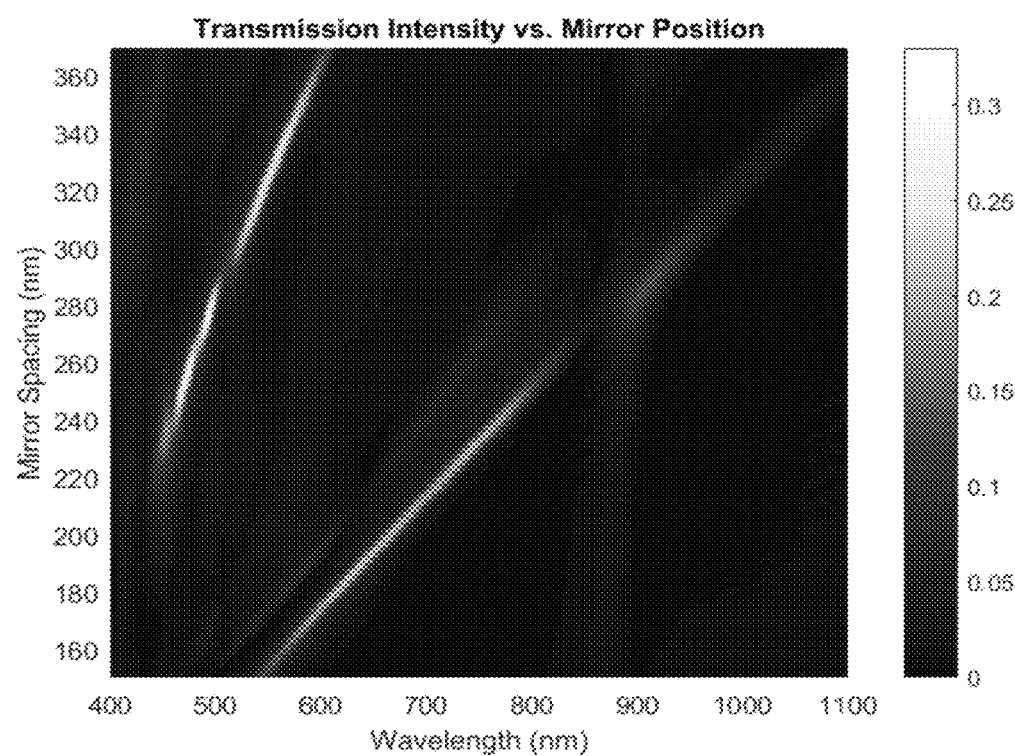
Figure 7F:
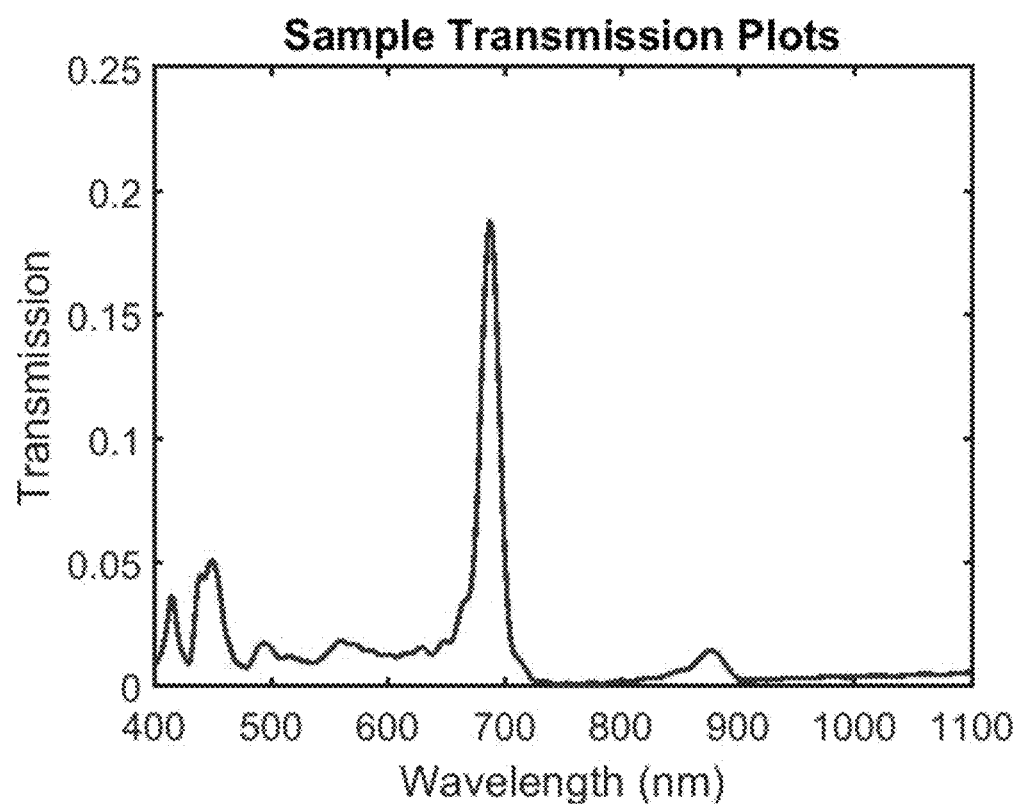
Figure 8A:
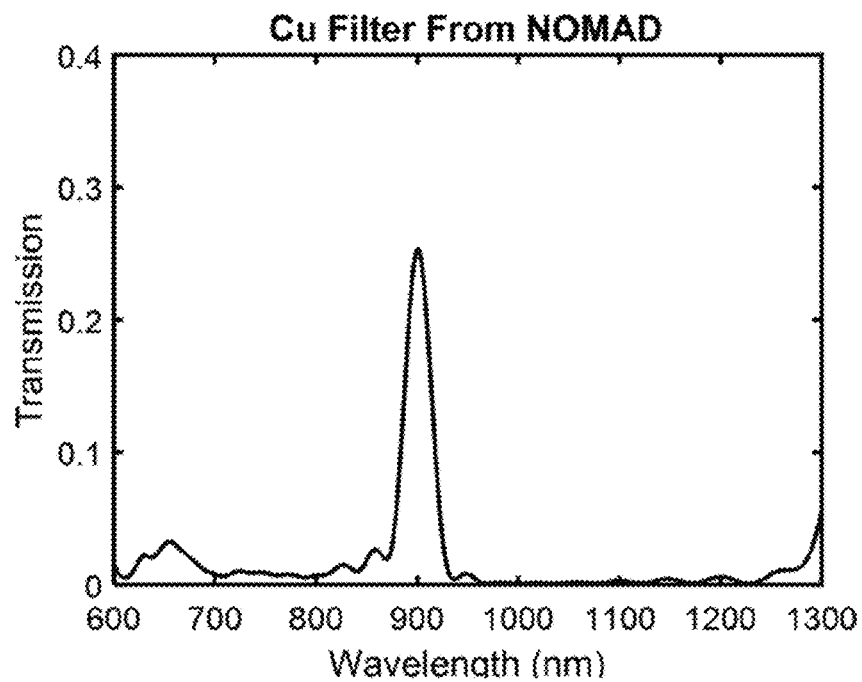
FIGS. 8A and 8B provide data results and plots showing the wavelength selectivity of slit narrowband filters in the infrared according to embodiments.
Figure 8B:
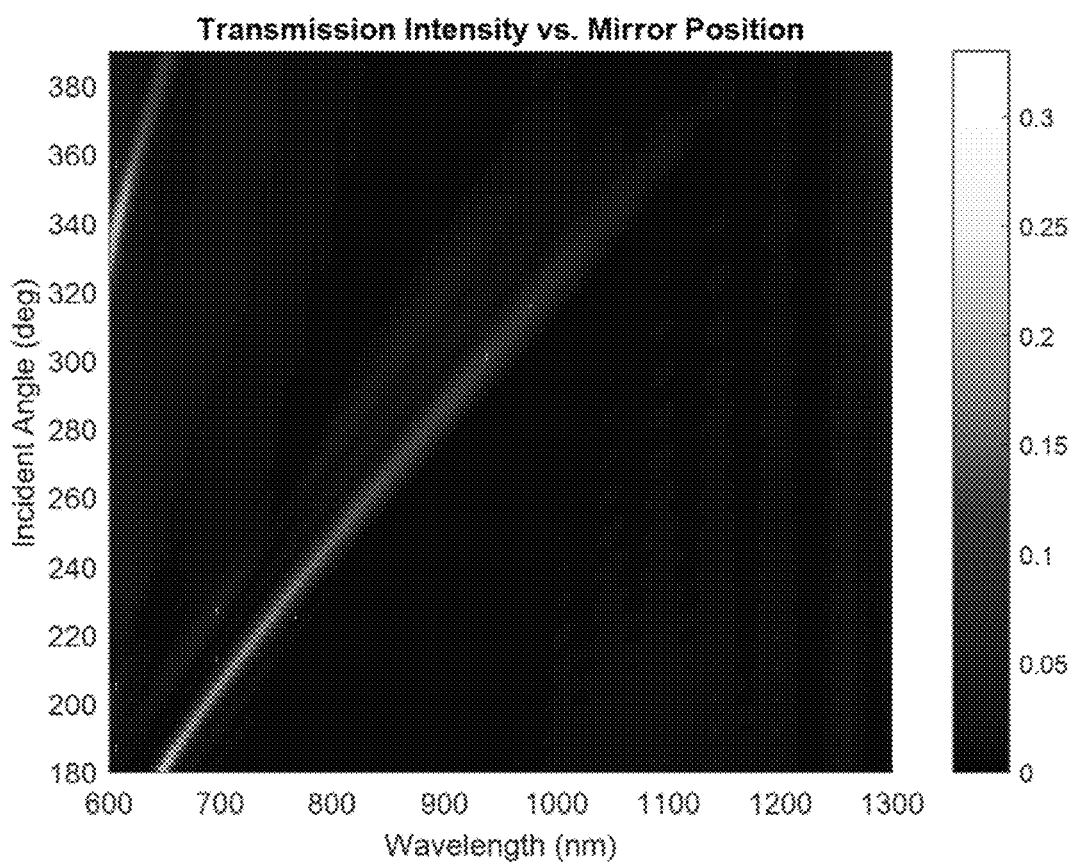

Using such embodiments it is possible to obtain highly specific extremely narrow spectral band filtering. For example, as shown in the theoretical plot provided in FIG. 6 and the plots showing data from exemplary narrowband filters provided in FIGS. 7A to 7F, by shifting the position of the mirror bodies relative to each other (i.e., mirror spacing) (e.g., in the examples provided from between 160 nm and 360 nm) it is possible to change the transmission wavelength of the filter thus allowing for narrowband filtering across the spectrum. Indeed, although the wavelength range covered by the embodiments shown in FIGS. 7A to 7F is restricted to the visible spectrum, it will be understood that the wavelength range may be extended outside of the visible spectrum by replicating the filter response for other material systems. For example, as shown in FIGS. 8A and 8B using a Cu system allows for embodiments of a narrowband filter to operate in the near-IR. Similar modifications can extend the usable wavelength range of embodiments to even longer wavelength including the far-IR and microwaves. One skilled in the art will understand that the scaling factors necessary to adapt the filters to different wavelength regimes may be obtained using Rayleigh scaling factors.

Embodiments Incorporating Variable Highly Coupled Parameters

Although the above discussion has focused on the ability to alter the transmission wavelength of narrowband filters by altering the mirror spacing, embodiments may also use other highly coupled parameters to alter the filter properties.

Figure 9:
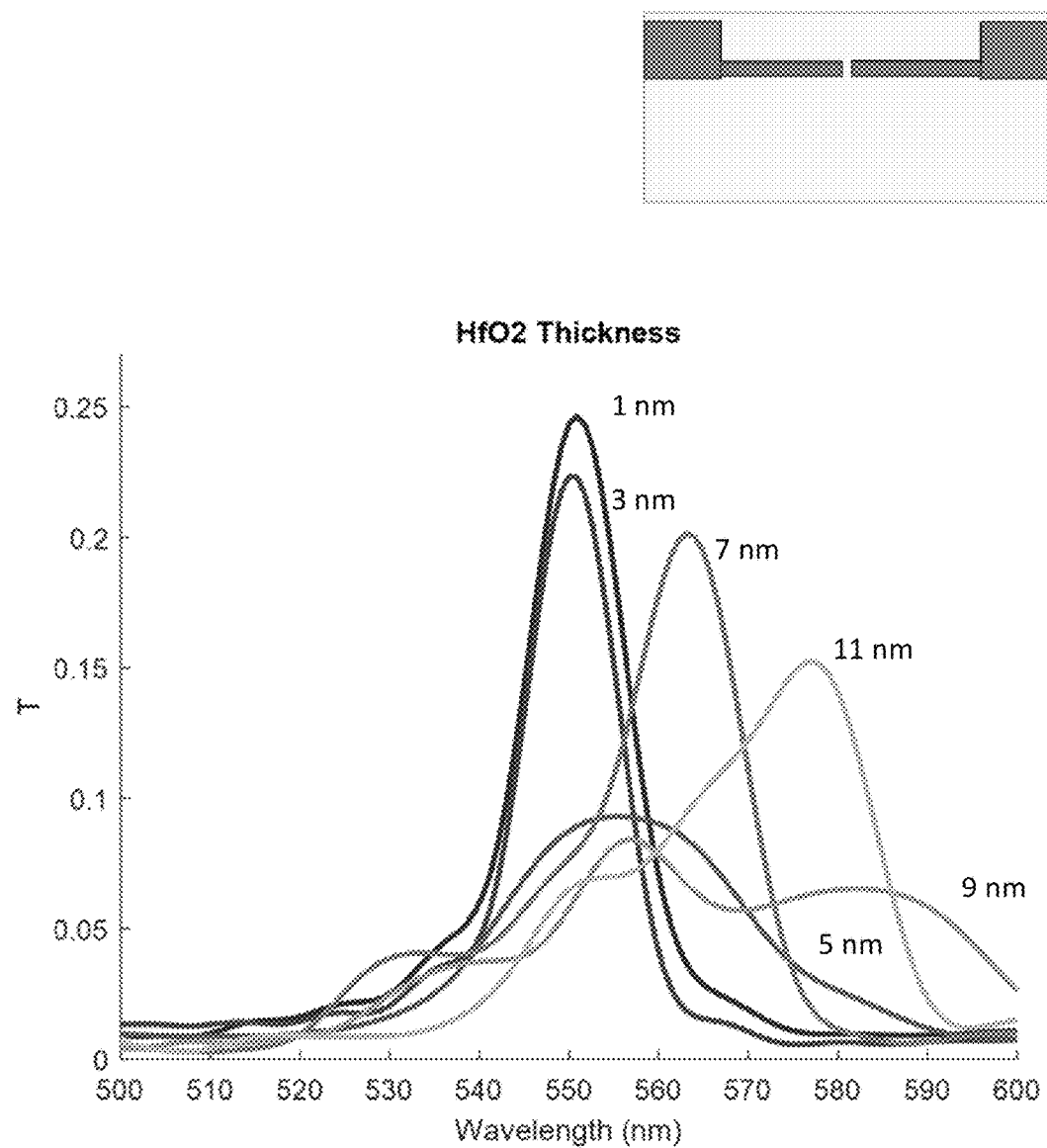
FIG. 9 provides a data plot showing the variability of transmission properties vs protective oxide layer for slit narrowband filters according to embodiments.

For example, as shown in FIG. 9, including a protective oxide and modifying the thickness of that oxide (within a suitable range) can also result in tailoring of the filter transmission properties around a specified wavelength, however increasing the thickness of the oxide film above a suitable range can have a negative effect on the transmission efficiency of the filter. Accordingly, for example, in many embodiments within the visible spectrum the thickness of the protective oxide film is no greater than about 12 nm, in other embodiments no greater than about 7 nm, and in still other such embodiments no greater than 3 nm. In various embodiments, the protective oxide film has a thickness of no greater than 1 nm.

Figure 10A:
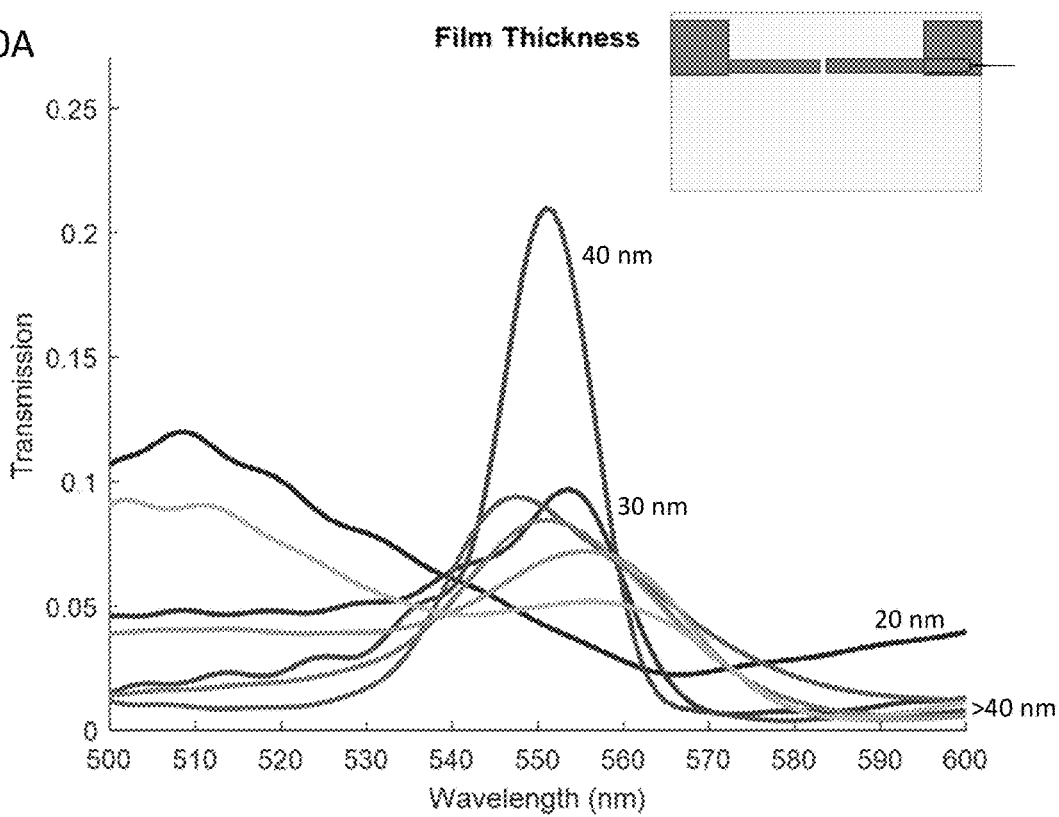
FIGS. 10A and 10B provide data plots showing the variability of transmission properties vs thin film layer thickness for slit narrowband filters according to embodiments.
Figure 10B:
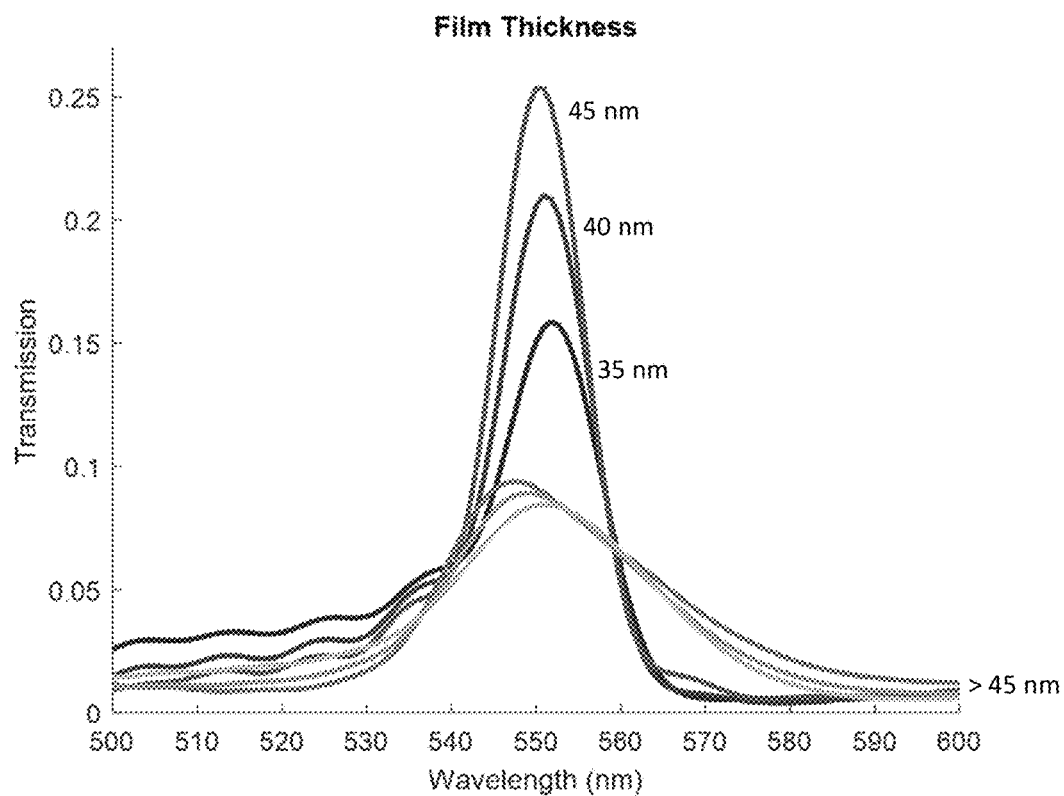

As shown in FIGS. 10A and 10B, adjusting the thin film thickness also can affect the transmission of embodiments the narrowband filter. Specifically, FIG. 10A shows the transmission of embodiments of a filter where the thickness of the thin film varies from 20 to 80 nm, while FIG. 10B shows the transmission of embodiments of a filter where the thickness of the film varies from 40 to 60 nm. Accordingly, for example, in many embodiments within the visible spectrum the thickness of the thin film is no greater than about 80 nm and no less than 20 nm, in other embodiments no greater than about 60 nm and no less than 40 nm. In still other such embodiments, the think film has a thickness of no greater than 50 nm and no less than 40 nm.

Figure 11A:
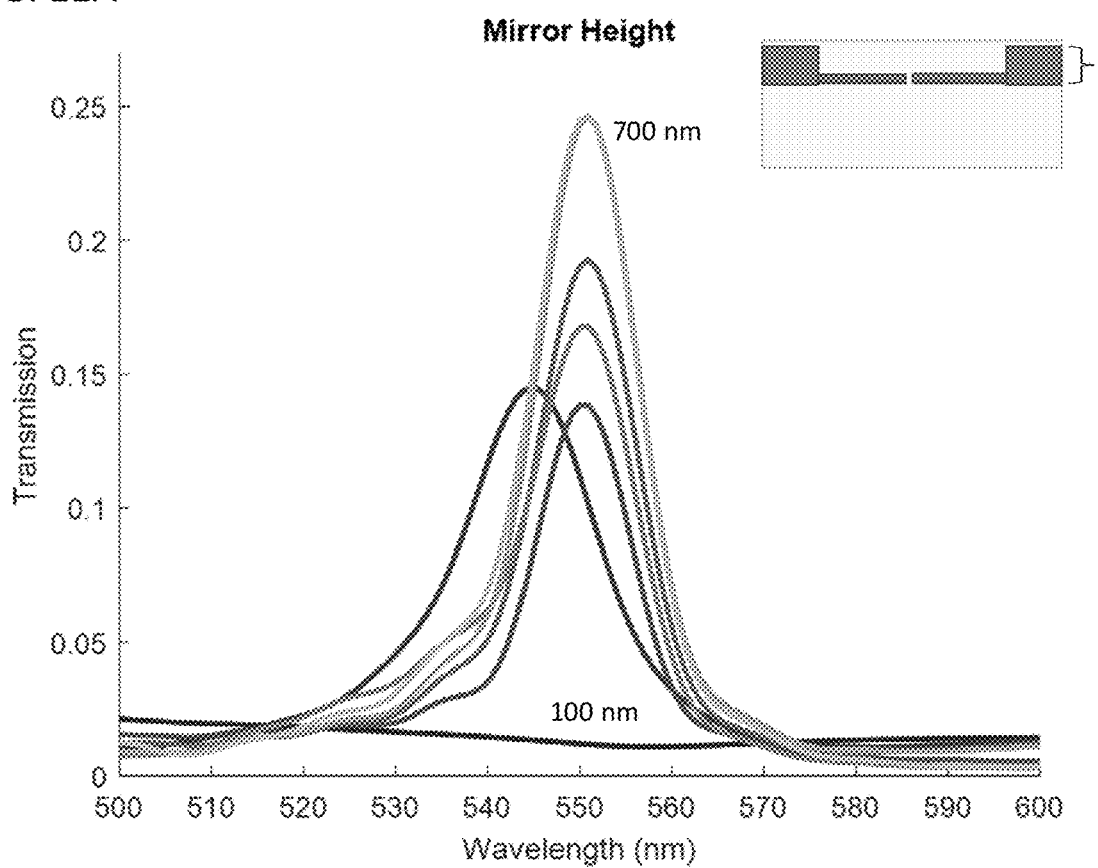
FIGS. 11A and 11B provide data plots showing the variability of transmission properties vs mirror height for slit narrowband filters according to embodiments.
Figure 11B:
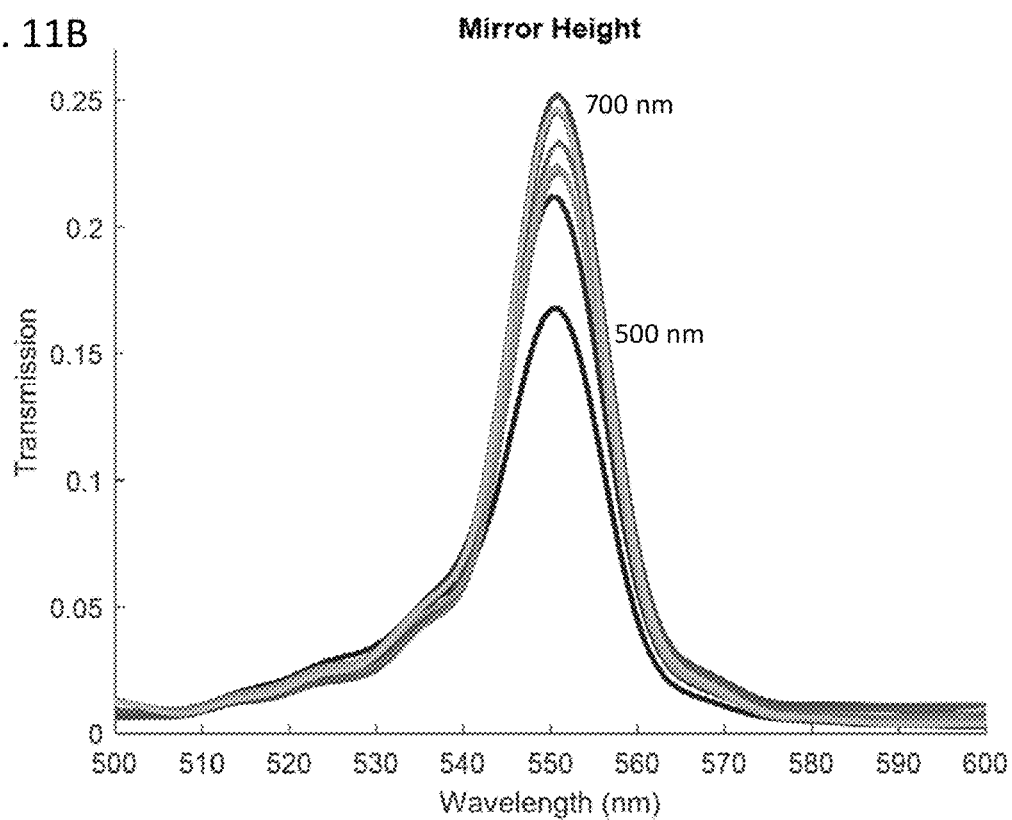

As shown in FIGS. 11A and 11B, adjusting the height of the mirrored body above the plane of the thin film layer also can affect the transmission of embodiments the narrowband filter. Specifically, FIG. 11A shows the transmission of embodiments of a filter where the height of the mirrored body above the thin film varies from 100 to 700 nm, while FIG. 11B shows the transmission of embodiments of a filter where the height of the mirrored body above the thin film varies from 500 to 700 nm. Accordingly, for example, in many embodiments within the visible spectrum the height of the mirrored body is no less than 100 nm, in other embodiments no less than 500 nm. In still other such embodiments, directed to longer infrared wavelengths, the mirror height above the thin film has a thickness of at least 700 nm.

Figure 12A:
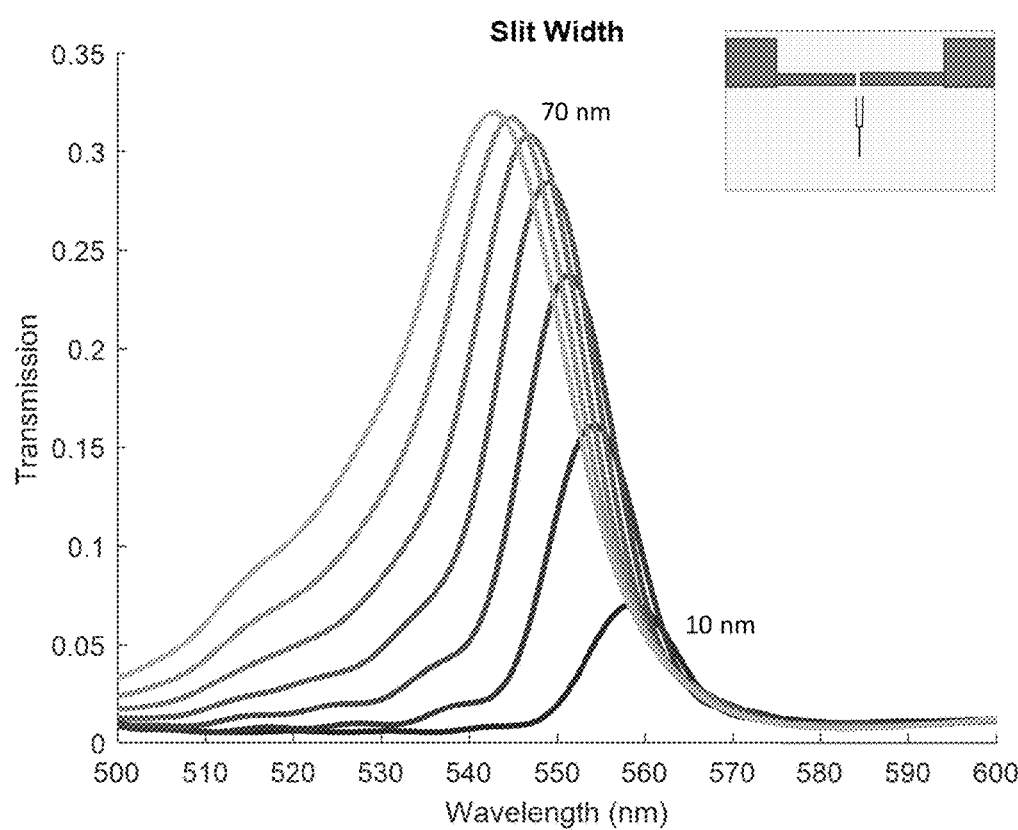
FIGS. 12A and 12B provide data plots showing the variability of transmission properties vs slit width for slit narrowband filters according to embodiments.
Figure 12B:
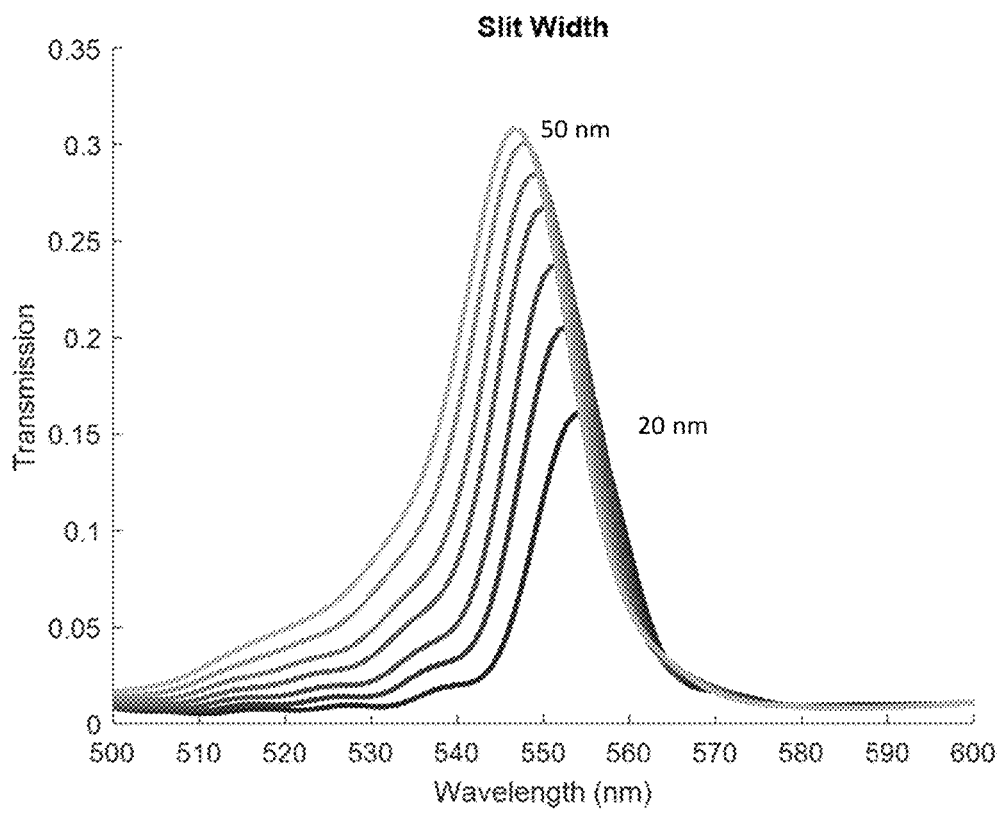

As shown in FIGS. 12A and 12B, adjusting the slit width also can affect the transmission of embodiments the narrowband filter. Specifically, FIG. 12A shows the transmission of embodiments of a filter where the slit width varies from 10 to 70 nm, while FIG. 12B shows the transmission of embodiments of a filter where the slit width varies from 20 to 50 nm. Accordingly, for example, in many embodiments within the visible spectrum the slit width is no less than 10 nm and no greater than 70 nm. In still other such embodiments, the slit width is no greater than 50 nm and no less than 20 nm.

Although specific parameters and values are shown in the figures, these are only exemplary. It will be understood that the parameters may be varied in any way such that the electrically conductive bodies and slit are configured in a relative geometry such that a resonance is created in electromagnetic radiation incident thereon such that only electromagnetic radiation of a specific spectral band is passed through the at least one slit. For example, modifications can extend the usable wavelength range of embodiments to even longer wavelength including the far-IR and microwaves. One skilled in the art will understand that the scaling factors necessary to adapt the filters to different wavelength regimes may be obtained using Rayleigh scaling factors. It will also be understood by those skilled in the art that, using the design parameters disclosed, it will be possible to use numerical optimization techniques, such as for example a Mesh Adaptive algorithm, such as, for example, the NOMAD, to determine optimal filters for applications within a specific parameter space. (See, e.g., M. A. Abramson, et al. The NOMAD project. Software available at https://www.gerad.ca/nomad, 2017; and S. Le Digabel. Algorithm 909: NOMAD: Nonlinear Optimization with the MADS algorithm. ACM Transactions on Mathematical Software, 37(4):44:1-44:15, 2011, the disclosures of which are incorporated herein by reference.)

Embodiments of Polarization Independent Filters

Figure 13A:
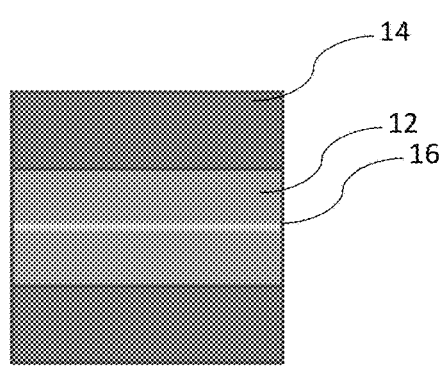
FIGS. 13A and 13B provide schematics of polarization dependent and independent slit narrowband filters according to embodiments.
Figure 13B:
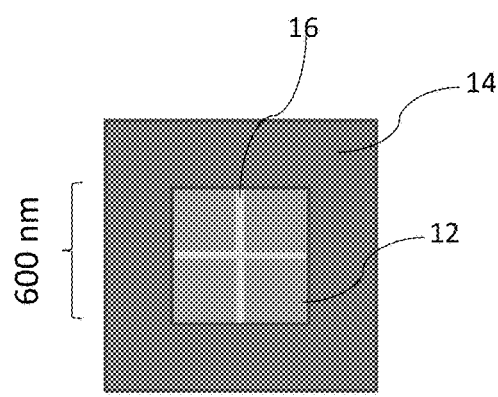
Figure 13C:
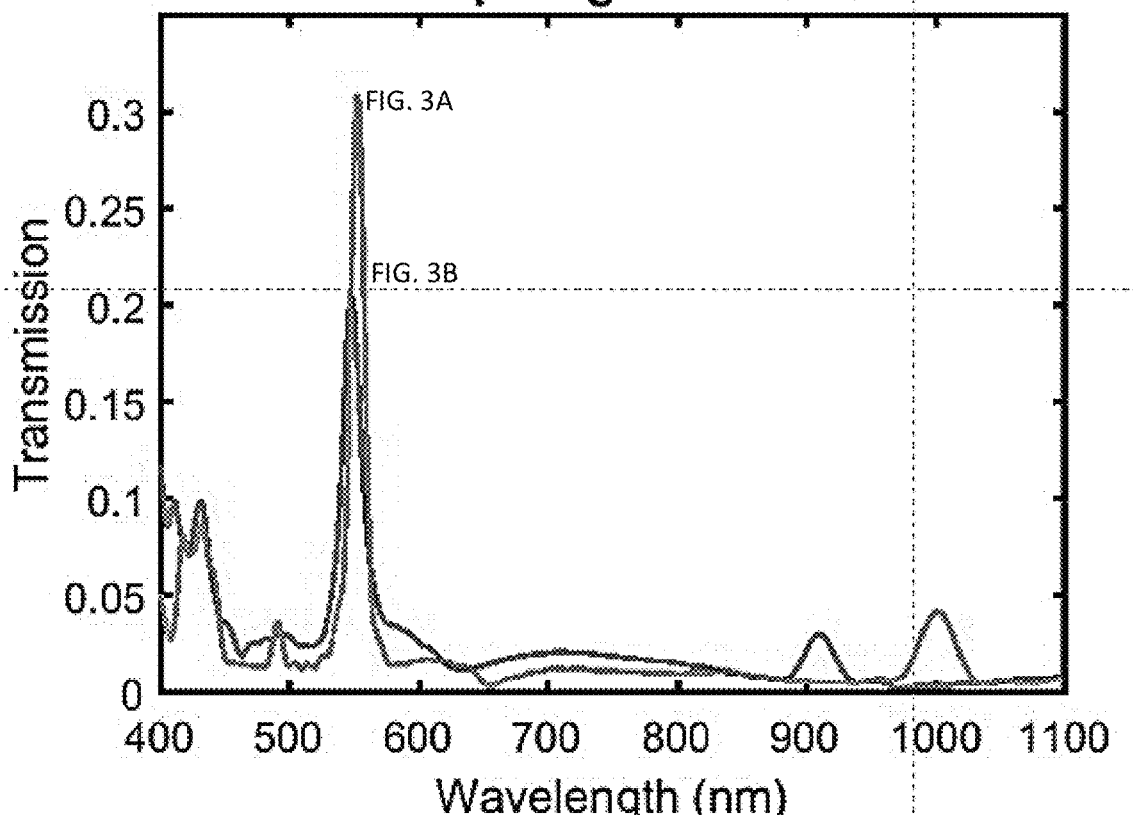
FIG. 13C provides data plots comparing the transmission properties of 2D and 3D slit narrowband filters according to embodiments.

Although the above embodiments have been described with reference to narrowband filters incorporating single and multiple slits disposed in parallel alignments (as shown in FIG. 13A) subject to polarization effect, in various embodiments the slits may be disposed in configurations such that the narrowband filter is polarization independent. For example, as shown in FIG. 13B many embodiments may incorporate 3-dimensional configurations of slits, such as slits set at perpendicular to each other, such that the narrowband filter is polarization independent. As shown in the data graph provided in FIG. 13C, such polarization independent slit configurations may have a slight attenuating effect on transmission, but do not affect the transmission selectivity of the filters. Although only parallel and perpendicular arrangements of slits are shown, it will be understood that any configuration and number of slits may be implemented as required by a specific application, e.g., incoming light source.

Embodiments of CMOS Pixels

Figure 14:
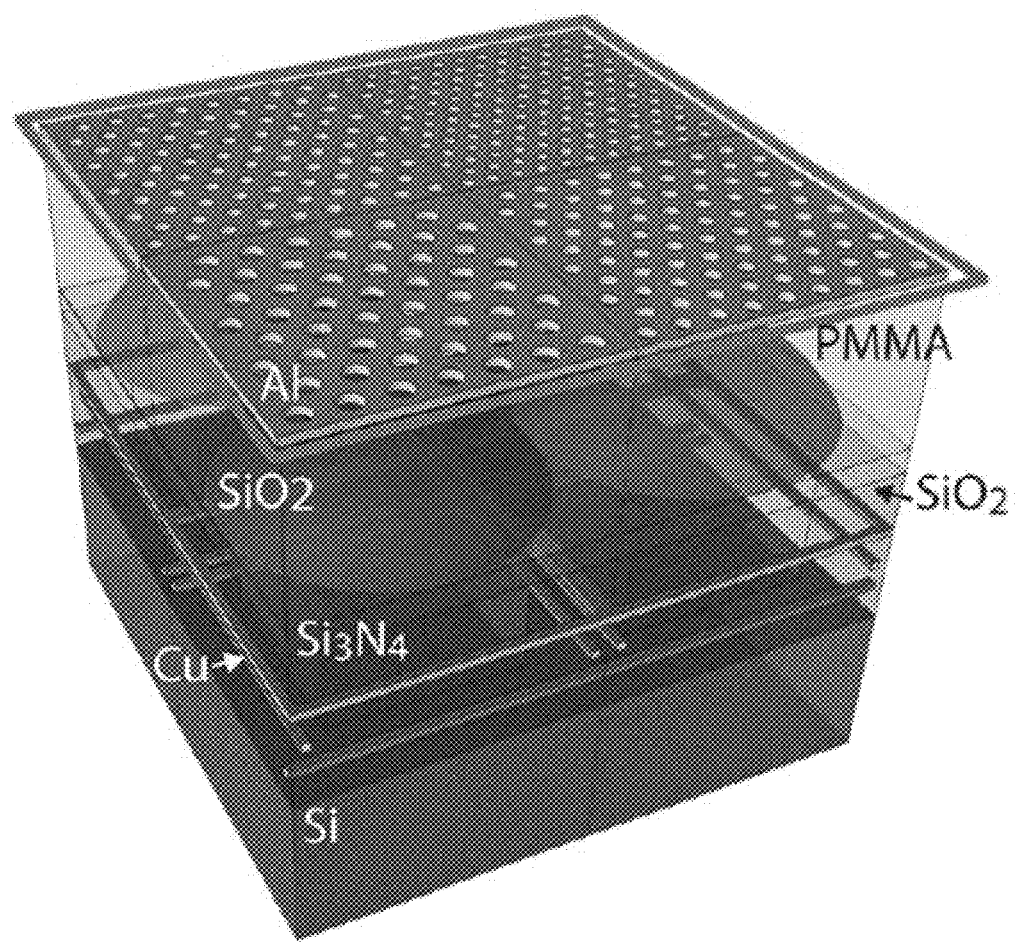
FIG. 14 provides a schematic of a CMOS pixel in accordance with the prior art.

Although the above discussion has focused on a description of narrowband light filters, generally, it will be understood that embodiments are also directed to pixels and arrays of pixels incorporating such filters. FIG. 14 provides a diagram of an exemplary CMOS sensor incorporating a conventional hole array RGB filter. These filters have been fabricated on the size scale of 5.6 $\mu m^2$. However, state-of-the art CMOS sensor pixels are now on the order of ~1 $\mu m^2$. Specifically, current smartphone sensors range from 1.12 to 1.5 $\mu m^2$, while full-frame sensors are as large as ~4.9 $\mu m^2$. Accordingly, a need exists for filters capable of being fabricated on this size scale.

Figure 15A:
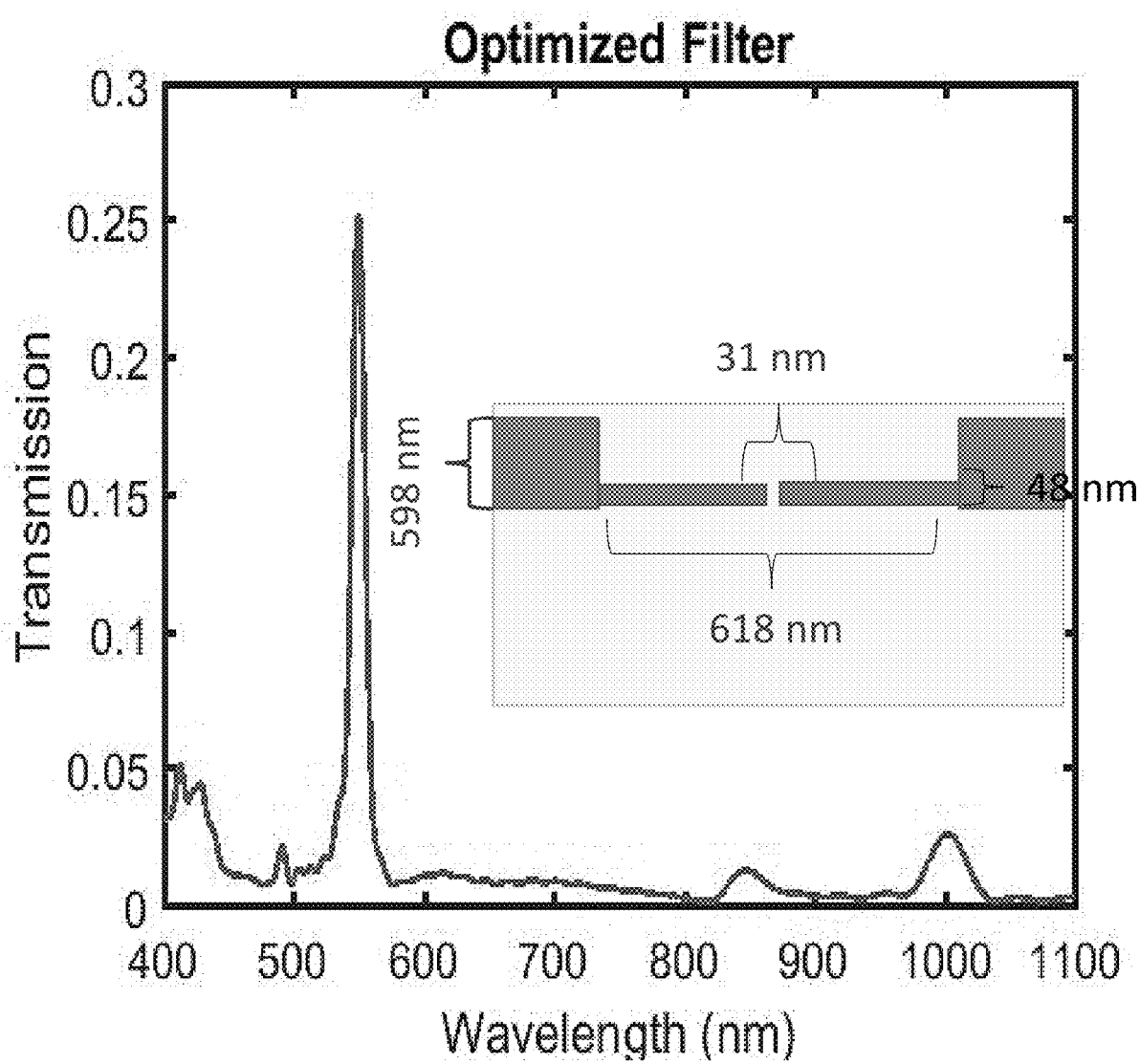
FIG. 15A provides a schematic of a slit narrowband filter according to embodiments.
Figure 15B:
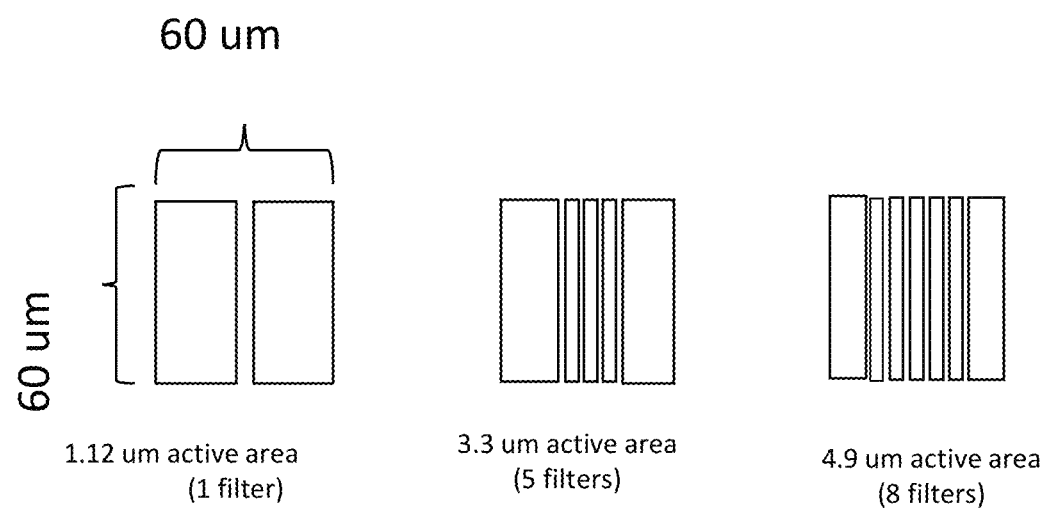
Figure 15C:
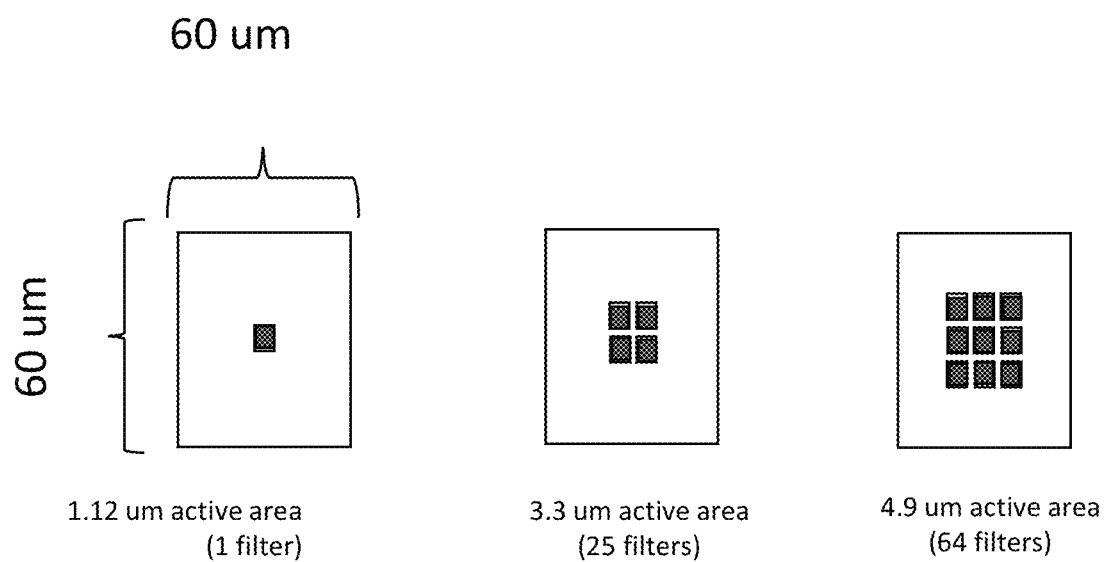
Figure 16A:
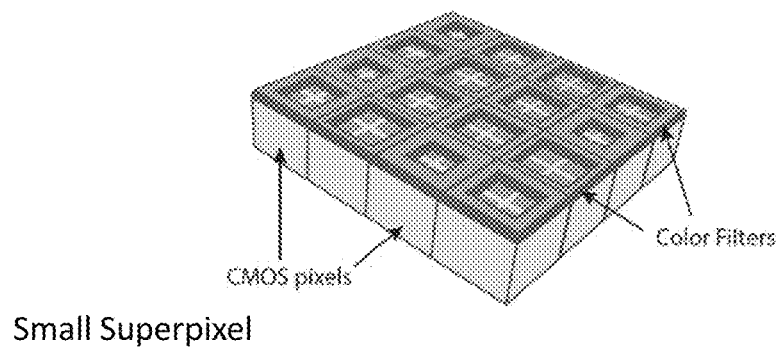
FIGS. 16A to 16C provide schematics of (6A) a small superpixel, (6B) a superpixel array, and (6C) a higher spectral resolution superpixel array incorporating slit narrowband filters according to embodiments.
Figure 16B:
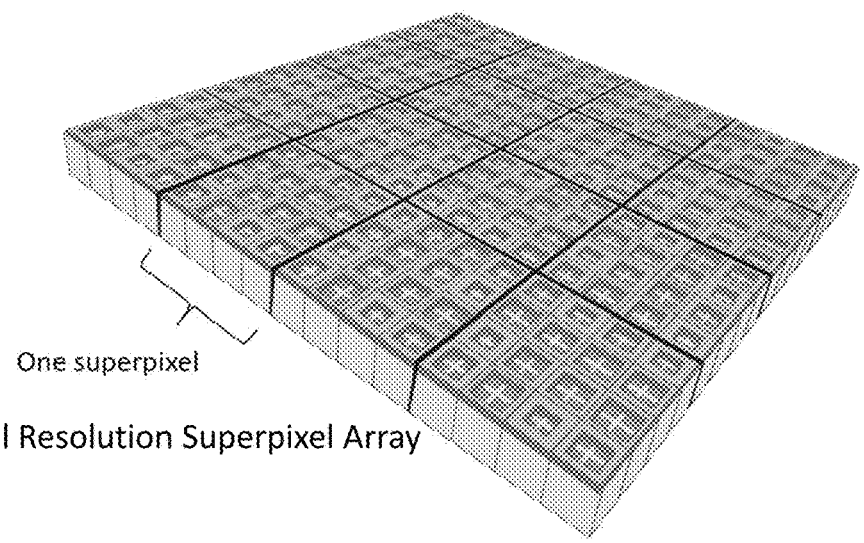
Figure 16C:
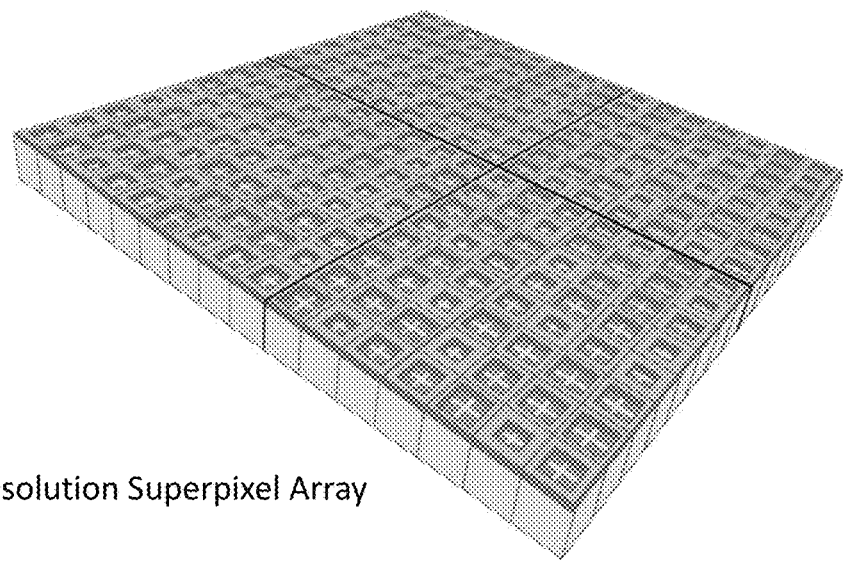

As previously, discussed, embodiments of the narrowband mirrored slit filters are operable on the size scale of 100 s of nm, as shown by the diagram of exemplary narrowband filter provided in FIG. 15A, making them ideal for use in modern CMOS sensors. Specifically, as shown in FIGS. 15B and 15C narrowband filters according to embodiments may be formed having active areas ranging across these CMOS sensor implementations. Accordingly, many embodiments are directed to filters for CMOS pixels, superpixels (e.g., spectrally homogeneous regions of spatially contiguous pixels) and higher spectral resolution superpixels incorporating arrays of narrowband filters in accordance with embodiments, as shown in FIGS. 16A to 16C.

Figure 17:
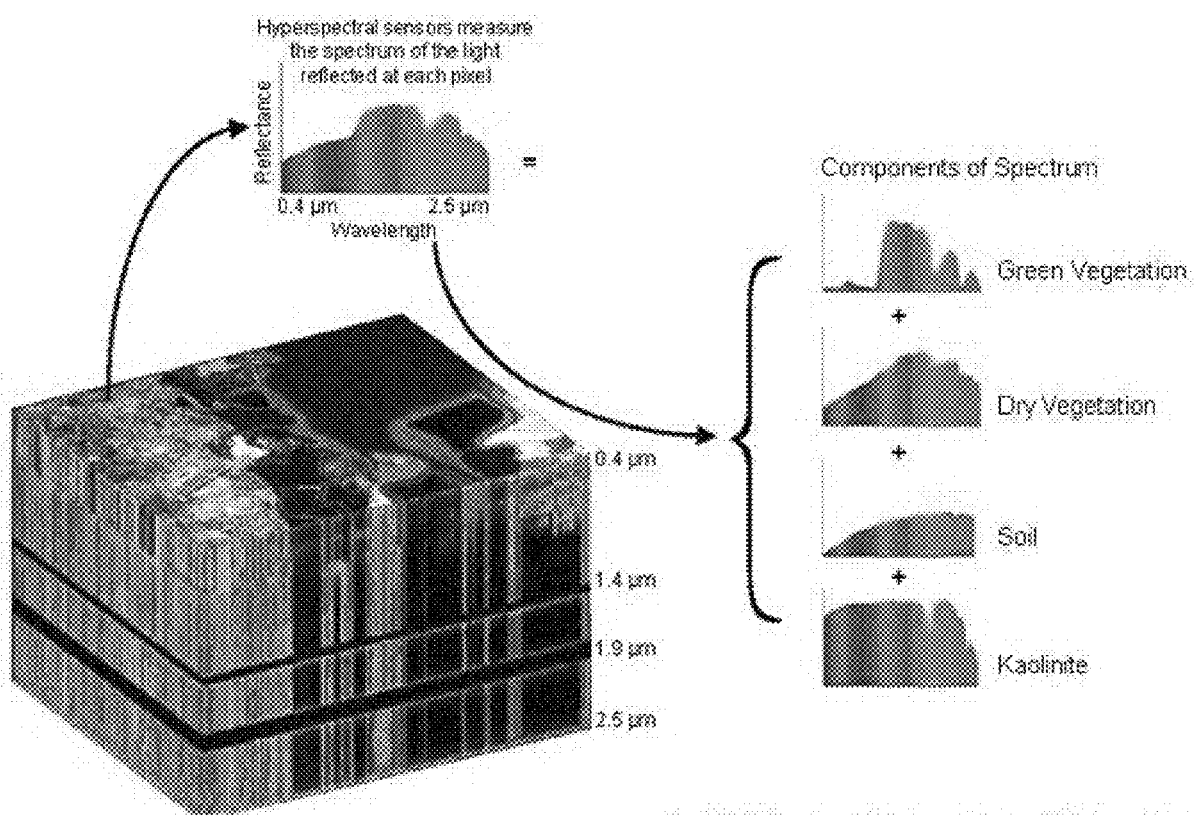
FIG. 17 provides an image from a hyperspectral sensor according to the prior art.

Hyperspectral means each pixel is composed of several spectral bands (numerous, e.g., in some instances on the order of 50 or more). While conventional RGB color image sensors lose spectral information during process, multispectral or hyperspectral imaging (HIS) collects image data simultaneously in dozens or hundreds of narrow, adjacent spectral bands, which makes it possible to derive a continuous spectrum for each image cell for material diagnostic characterization. In such superpixel image sensors narrowband filters are integrated on each cell of the superpixel, as shown in FIGS. 16C and 16C. As a result, detailed spectral information can be obtained from various cells of the superpixel. The ability to use narrowband filters with superpixel image sensors is important because, hyperspectral imaging (HIS) systems currently available face various problems, such as low speed, high cost and complex structure. As shown in FIG. 17, a large number of hyperspectral images allow quantitative analysis with high levels of accuracy and reliability. Using such hyperspectral sensors, it is possible to acquire large hyperspectral images (HSIs) with very high spatial resolution. Owing to the high spatial resolution, there are fewer mixed pixels in the HSIs, and the boundaries between these categories are much clearer. Although a relatively new technique, hyperspectral imaging (HSI) technique has been used widely and successfully in resource assessment, environmental monitoring, disaster warning and other remote sensing domains.

Figure 18A:
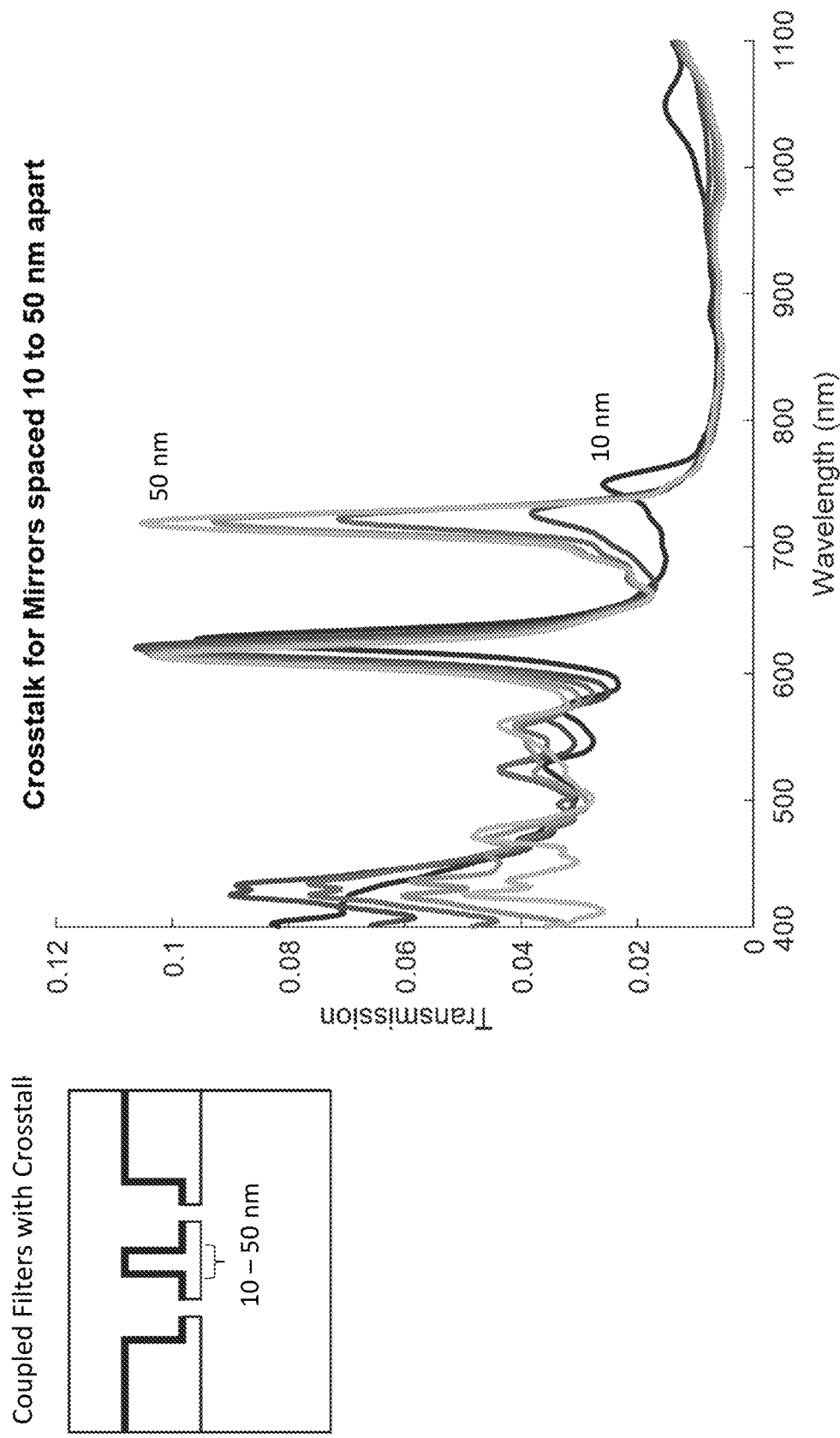
FIGS. 18A and 18B provide schematics and data plots for coupled and decoupled slit narrowband filters according to embodiments.
Figure 18B:
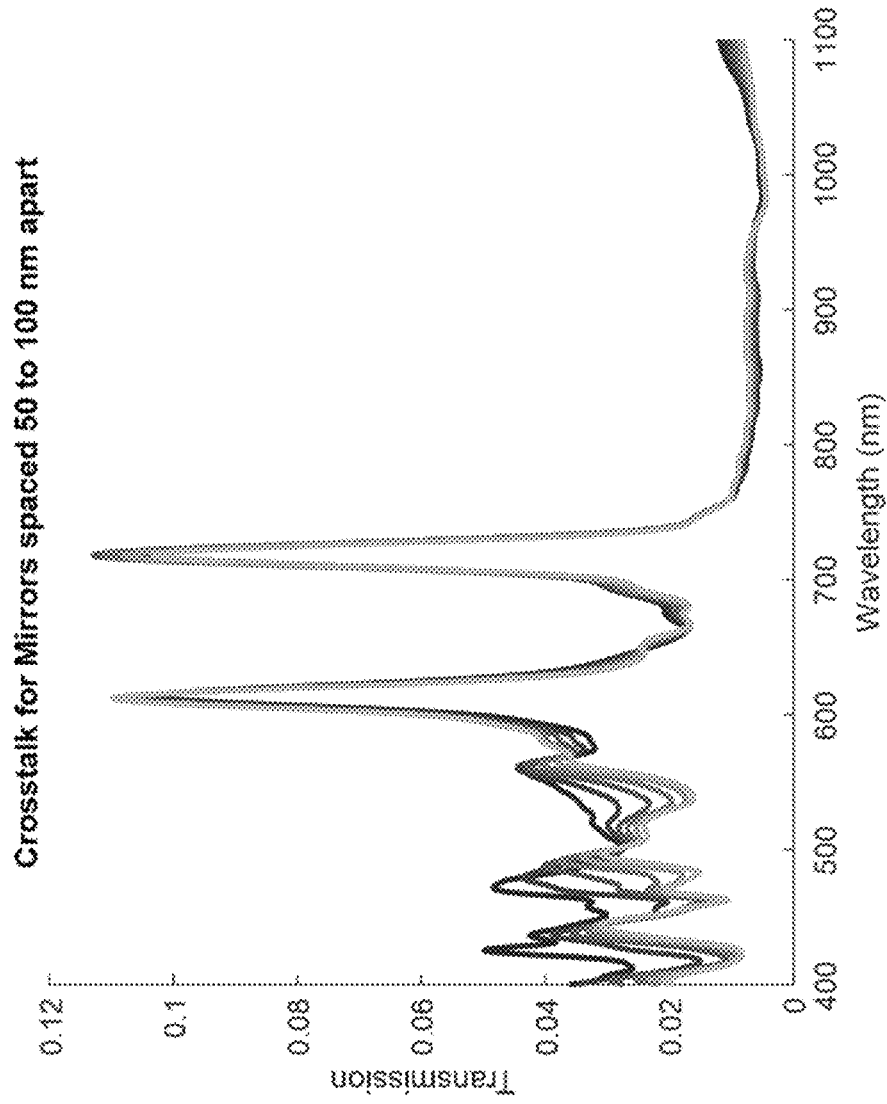
Figure 18B:
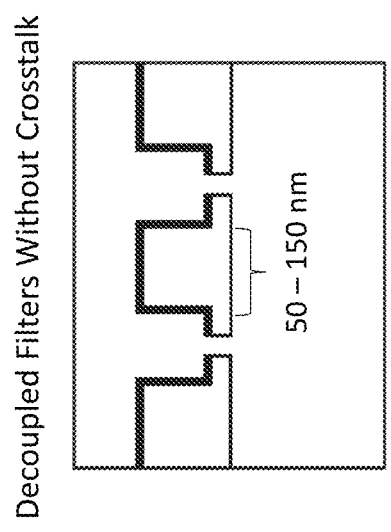

One of the challenges associated with incorporating filters into such closely spaced pixels is preventing interaction between the pixels, (i.e., crosstalk). However, as shown in FIGS. 18A and 18B, by increasing the thickness of the mirror body between the filters it is possible to reduce and eliminate crosstalk. Specifically, as shown in FIG. 18A, below 50 nm crosstalk effects attenuate the selective transmission of radiation, however, providing a mirror body between pixels of at least 50 nm eliminates all cross talk effects. Accordingly, in many embodiments the thickness of the mirror body between the filters on the pixels is at least 10 nm, and in other embodiments at least 50 nm.

Figure 19:
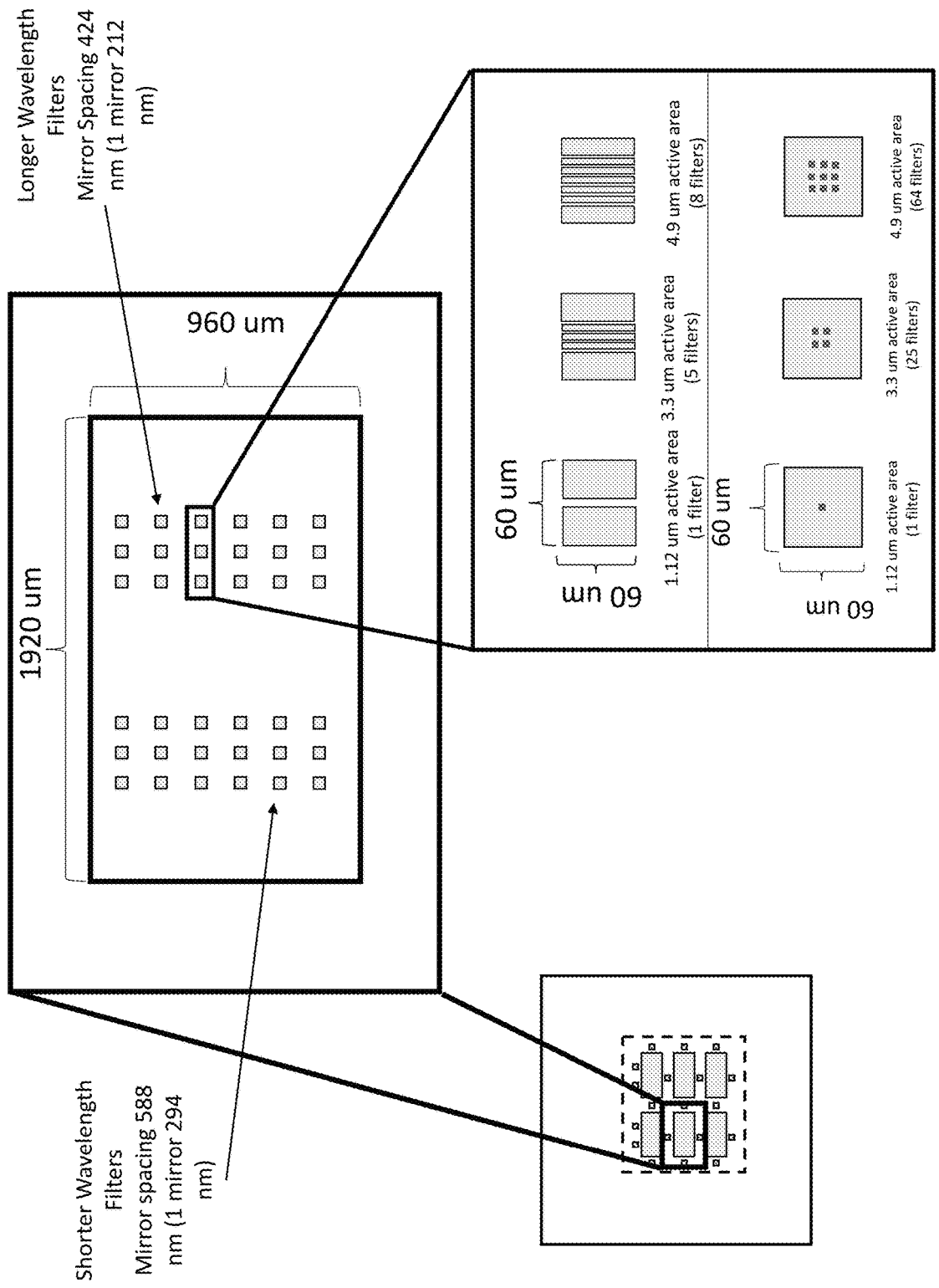
FIG. 19 provides a schematic of an array of slit narrowband filters according to embodiments.

Accordingly, many architectures and arrangements of pixels incorporating filters according to embodiments are possible. Some exemplary architectures, including spacing of filters are provided in FIG. 19. As shown, either 2D or 3D filters may be used in embodiments, and although specific arrangements of filters are shown, it should be understood that any suitable configuration and arrangement may be used.

Embodiments of Imprint Methods of Fabrication

Figure 20A:
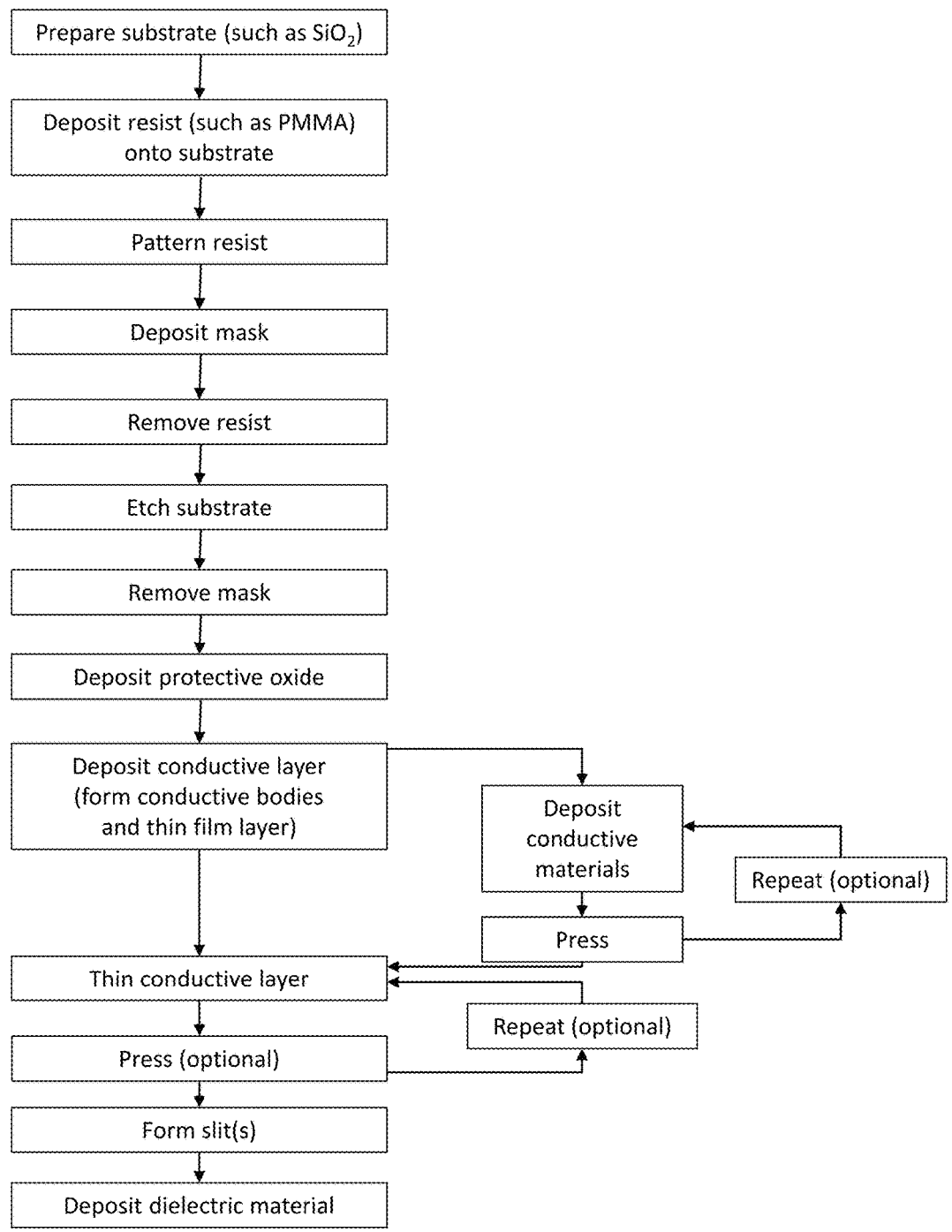
FIGS. 20A and 20B provide flow charts of an imprint method for fabricating slit narrowband filters according to embodiments.

Although the above-discussion has focused on embodiments of narrowband filters and pixels formed using such filters, embodiments are also directed to processes for fabricating narrowband light filters. Many embodiments are directed to imprint methods. A flow chart and schematic for such an imprint process are set forth by FIGS. 20 and 21. As shown, in the flow chart provided in FIG. 20A, in many such systems a substrate is prepared, and a resist material is deposited onto the substrate. The substrate is formed of a dielectric material in many embodiments of methods of formation, and a silica substrate ($SiO_2$) is used in some exemplary embodiments. According to such embodiments, a resist, such as poly(methyl methacrylate) (PMMA), is then deposited on the substrate and prepared for patterning. Patterning of the resist may be done using a suitable lithography method, such as, for example, electron beam lithography or photolithography. In various exemplary embodiments, the patterns in the resist are specifically made to describe the geometries that will become dielectric pillars or fins (depending on whether the filter is polarization-independent or polarization-dependent, respectively) later on in the process. The pillars and fins are formed of $SiO_2$ according to other such embodiments. Once the resist is patterned and developed, a mask is deposited onto the substrate and resist in accordance with embodiments of the invention. In some embodiments, the mask may be deposited via electron beam evaporation or other similar nanofabrication techniques. The mask is Cr in some exemplary embodiments. After depositing the mask, the resist is removed in accordance with various embodiments of the inventive method by employing appropriate techniques (for example, rinsing the sample with acetone and isopropanol).

Figure 22:
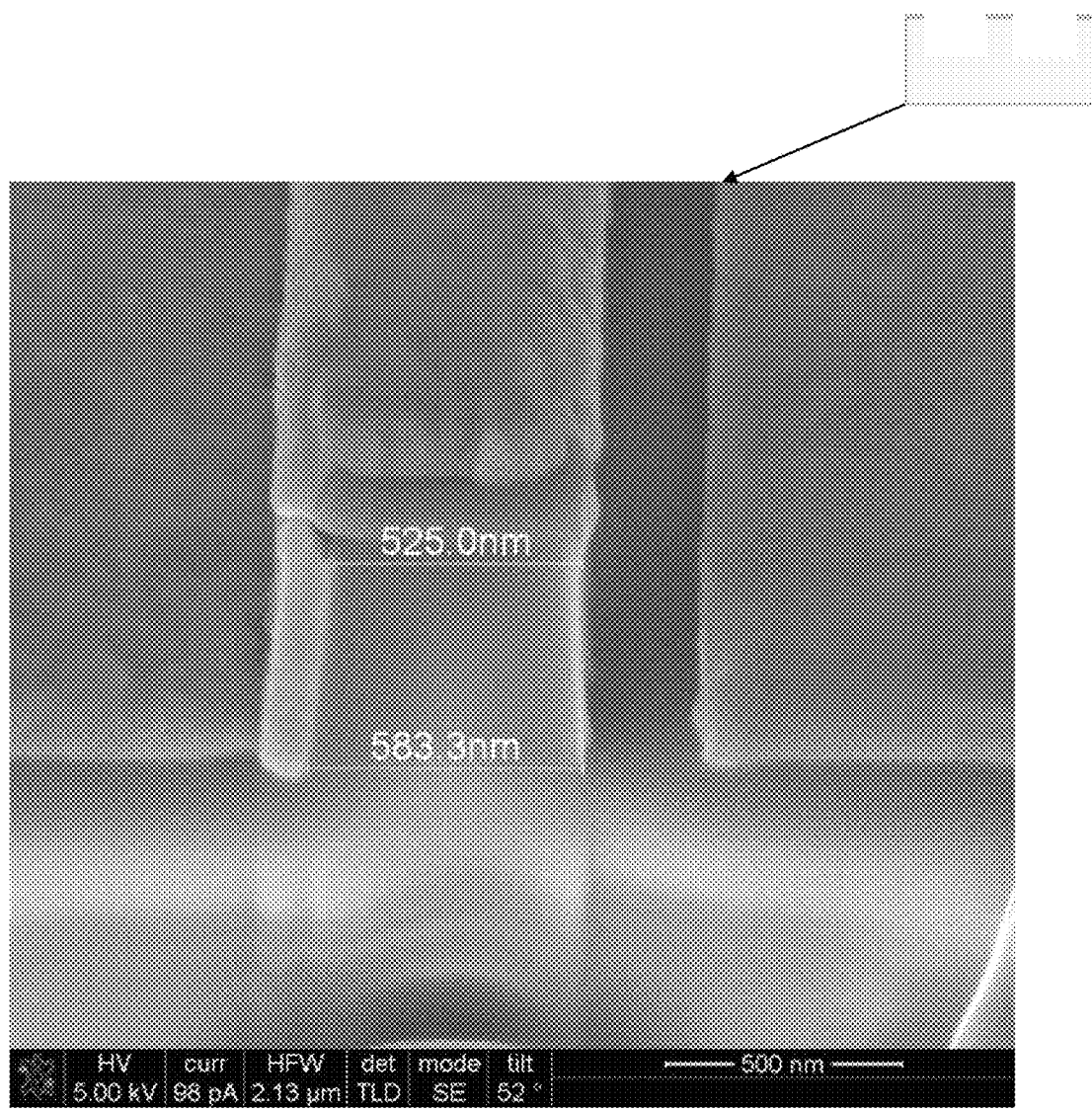
FIGS. 22 to 25B provide images of slit narrowband filters during fabrication using an imprint method according to embodiments.
Figure 23:
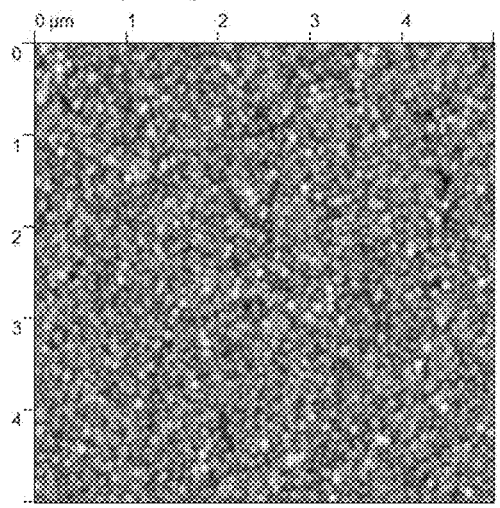
Figure 23:
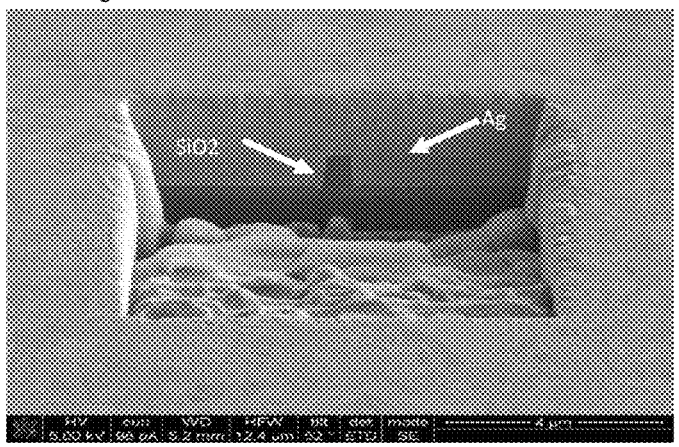
Figure 23:
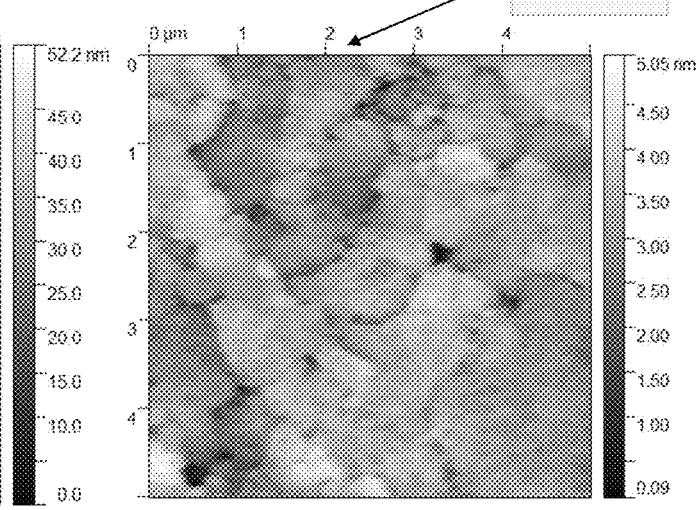
Figure 23:
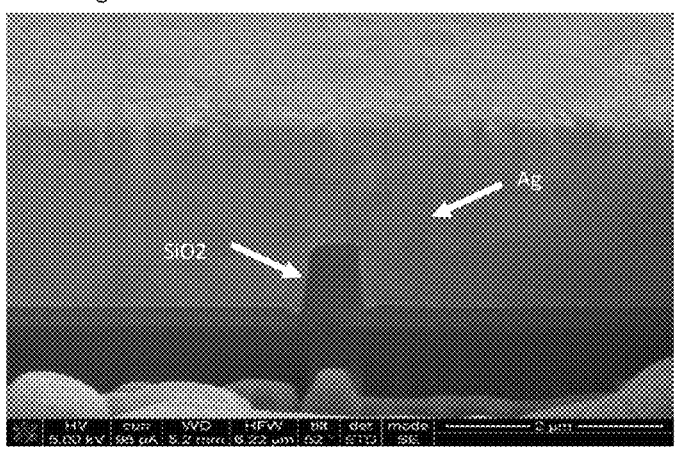

When the resist is removed, some previously-covered portions of the substrate are left exposed and unprotected by the mask. In such embodiments, an etching process is then employed following the removal of the resist, and exposed parts of the substrate are etched down, forming an uneven surface (as shown in the exemplary image provided in FIG. 22). In some such exemplary embodiments, a plasma etch system may be used to etch the substrate. The thickness of the electrically conductive bodies of the narrowband light filter will be affected by the amount of etching in some such embodiments. Following the etching process, in accordance with embodiments of methods of formation, the remaining mask material is removed. For instance, in embodiments where the mask material is Cr, Cr-7 may be used during the removal process. A protective oxide layer such as $HfO_2$ is then deposited directly onto the substrate in many embodiments of forming such narrowband light filters. In many such embodiments, an electrically conductive layer (such as metal) is then deposited on top of the protective oxide layer; this electrically conductive layer will become the electrically conductive thin film and bodies of the narrowband light filter. In some embodiments, electron beam evaporation is first used to deposit the electrically conductive material. The initial results (as shown in exemplary images shown in FIG. 23, top) are often rough. To form smooth and consistent layers, in many embodiments of the inventive method, the deposited electrically conductive material is then pressed with even pressure. In some such embodiments, the depositing and pressing steps may be repeated. In yet other embodiments, during a pressing step, the sample is pressed at about 2000 torr for 18 hours while at 175° C. In still other embodiments, one electrically conductive material deposition step with electron beam evaporation deposits about 1.5 µm of Ag or Cu. In accordance with yet other such embodiments, the electrically conductive material is deposited with substrate rotation in order to make deposition as conformal as possible.

Figure 24:
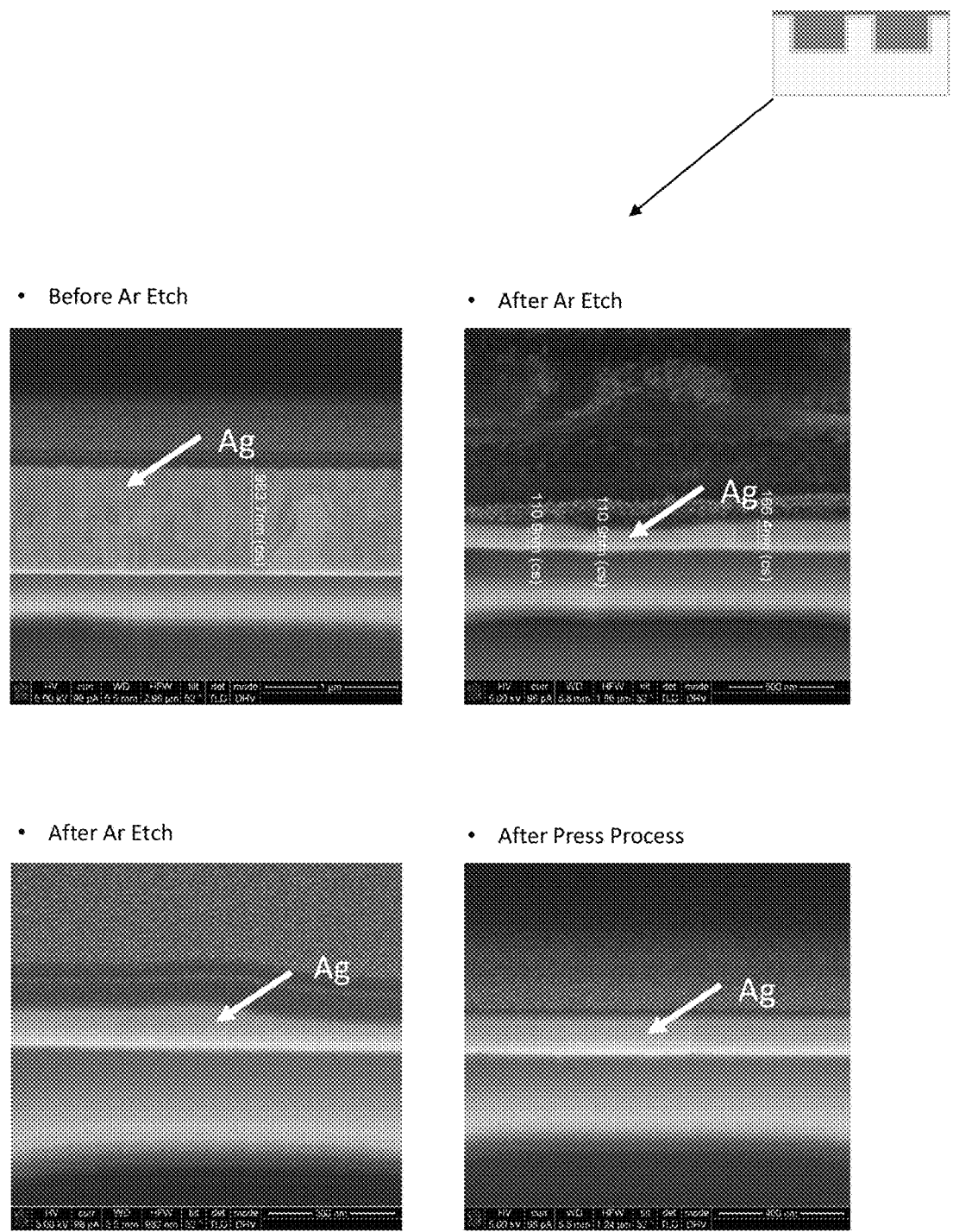
Figure 25A:
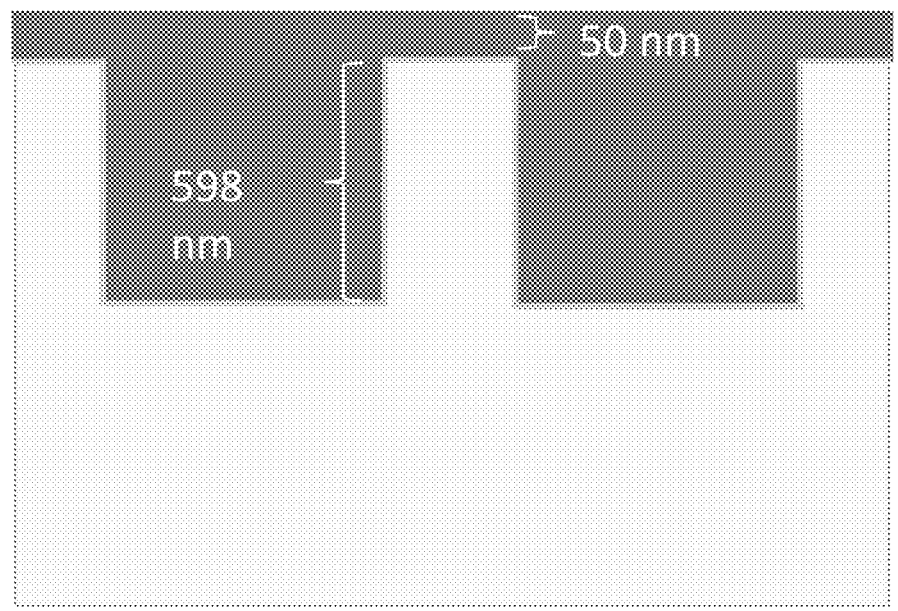
Figure 25B:
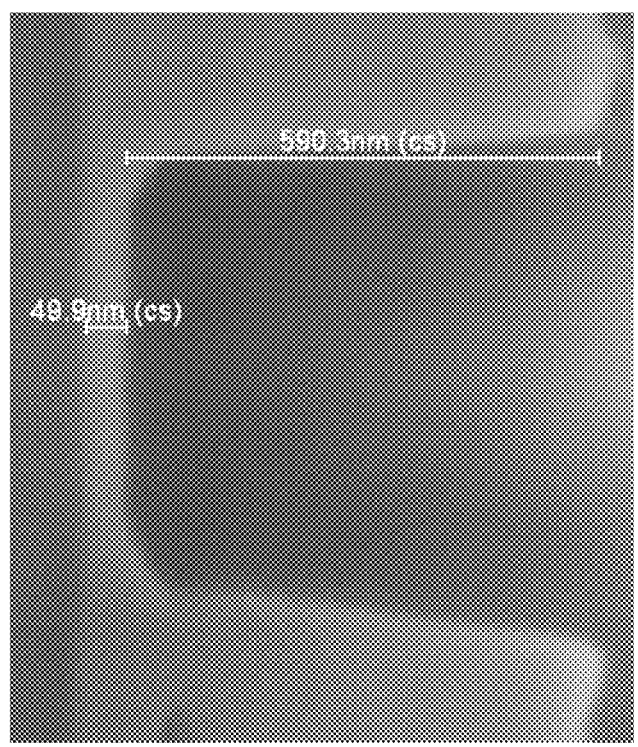

Following depositing and pressing the electrically conductive material, the electrically conductive material layer then undergoes a thinning step in accordance with embodiments of the invention. In some exemplary embodiments, the electrically conductive layer is thinned to a desired thickness with a plasma etch system (as shown in the exemplary images shown in FIG. 24, top). According to other such embodiments, optional additional pressing steps may be taken during, or after, the thinning process to ensure even thinning of the electrically conductive material (as shown in the exemplary image shown in FIG. 24, bottom). As shown in FIG. 25A and 25B, which provides exemplary images of the imprint method in accordance with an exemplary embodiment of the invention, the electrically conductive thin film layer and electrically conductive bodies conform to the dimensional limits desired. The slit, or slits, may then be milled through the electrically conductive and protective oxide layers in accordance with embodiments of the invention. In such embodiments, each slit is positioned between the electrically conductive bodies based on the desired geometry. In yet other such embodiments, a He ion beam is used to mill the slits. For many embodiments, the process is completed when additional dielectric material is deposited to cover the electrically conductive material and slit(s). Some exemplary embodiments deposit the dielectric material with PECVD, and for still other exemplary embodiments, the dielectric material is $SiO_2$. Narrowband light filters formed in accordance with such embodiments of the invention contain structural geometries that allow a beam of incident electromagnetic radiation to be reflected between the electrically conductive bodies before passing through the at least one slit.

Figure 20B:
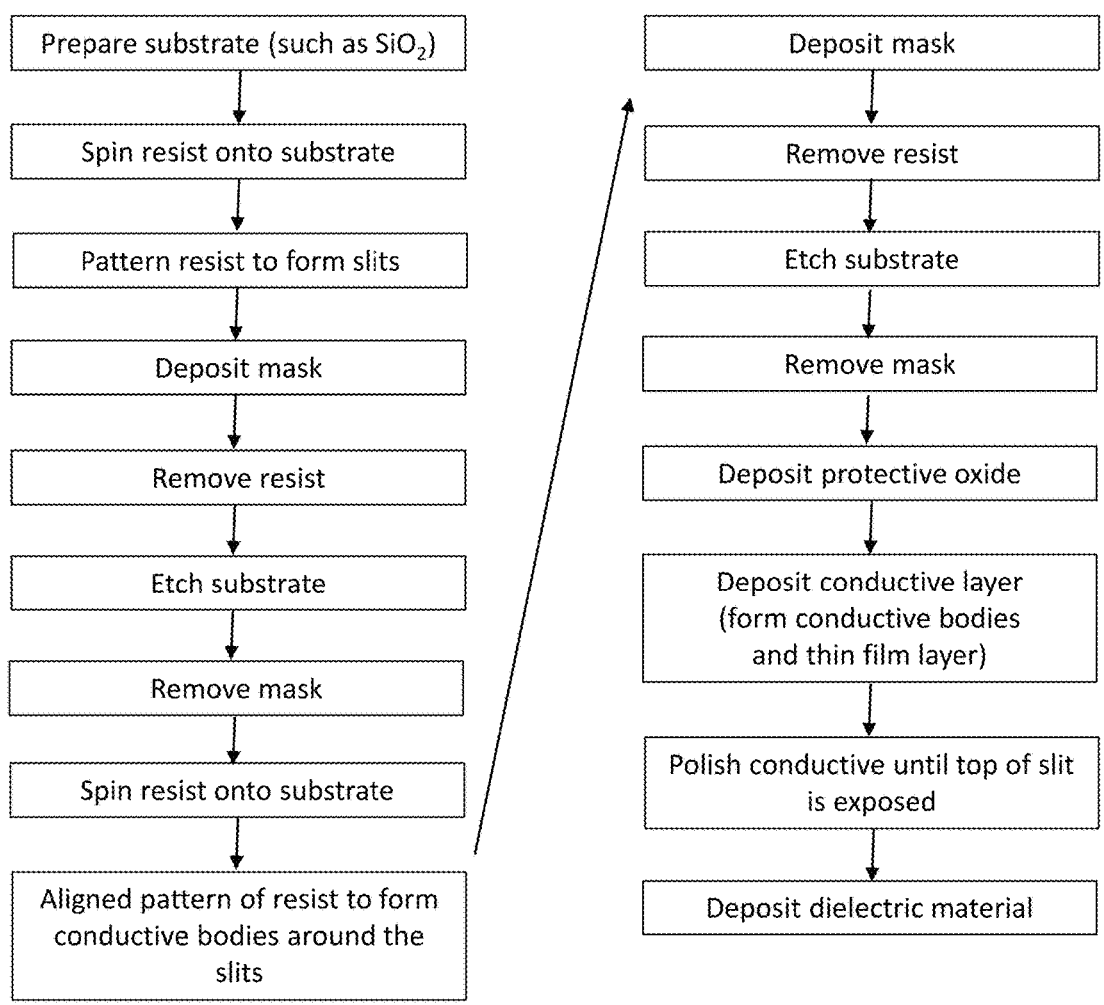
Figure 21:
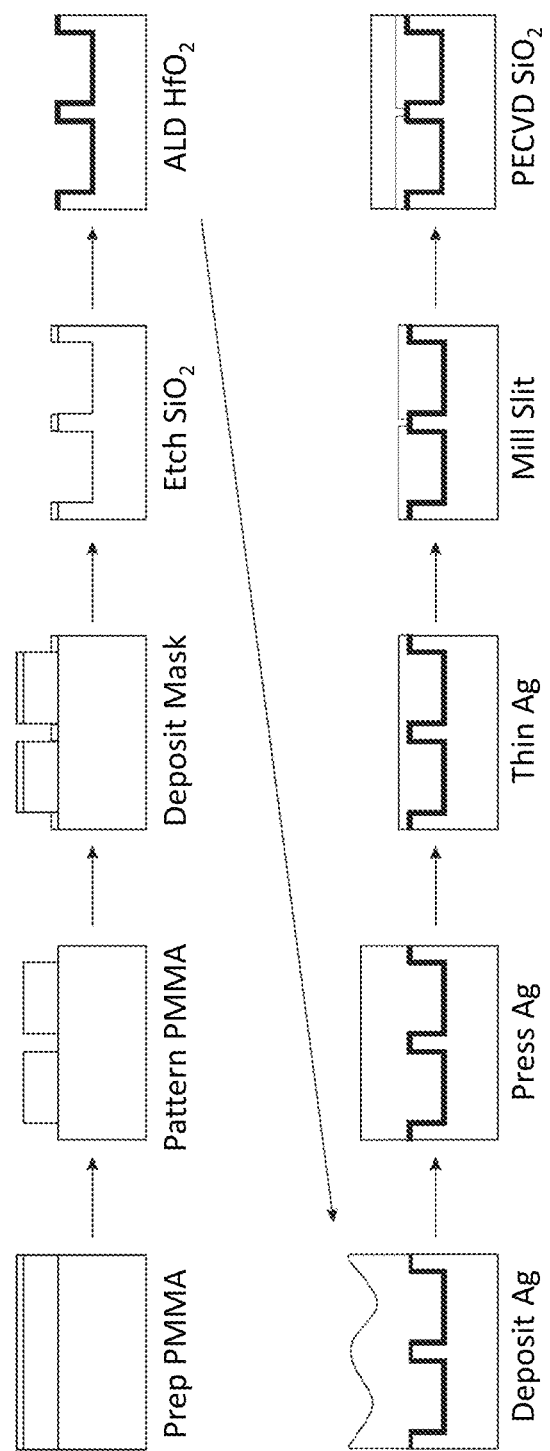
FIG. 21 provides a schematic of an imprint method for fabricating slit narrowband filters according to embodiments.

Although the above discussion has focused on specific implementations used to create exemplary embodiments, it will be understood that these processes may be modified and generalized, as shown for example in the flow chart of FIG. 20B. For example, the resist may be spin coated onto the surface of the substrate according to standard methods. Similarly, the resist may be patterned to form the slit via standard lithographic techniques. Similarly, spin resist patterning and deposition may then be used to form the electrically conductive bodies around the slits. Following the etch of the substrate (using any suitable etching technique) an optional protective oxide may then be deposited followed by the deposition of the electrically conductive layer to form the electrically conductive bodies and thin film layer. The top of the electrically conductive layer may then be polished to expose the opening in the thin film layer and the dielectric disposed therein. A dielectric material may be deposited according to known methods. Moreover, although one suitable industrial standard fabrication methodology is described in FIG. 20B, it will be understood that any other suitable fabrication technique or set of techniques may be used capable of forming the required features.

Embodiments of Lift-Off Methods of Fabrication

Figure 26A:
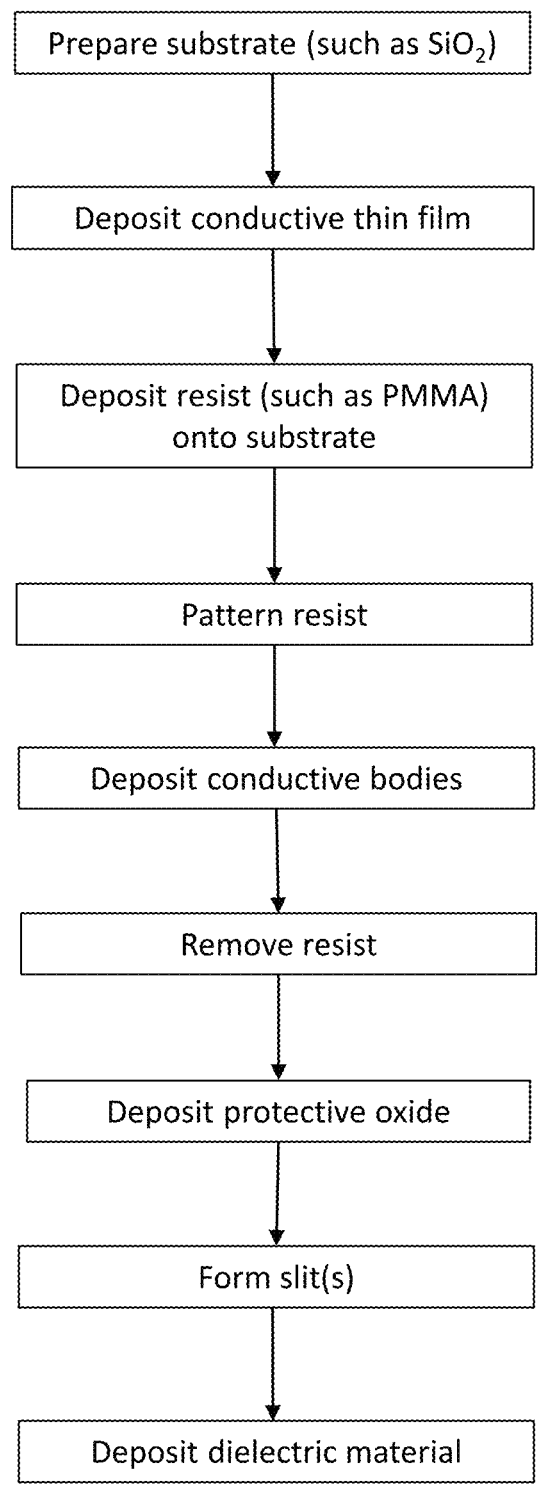
FIGS. 26A and 26B provide flow charts of a lift-off method for fabricating slit narrowband filters according to embodiments.
Figure 26B:
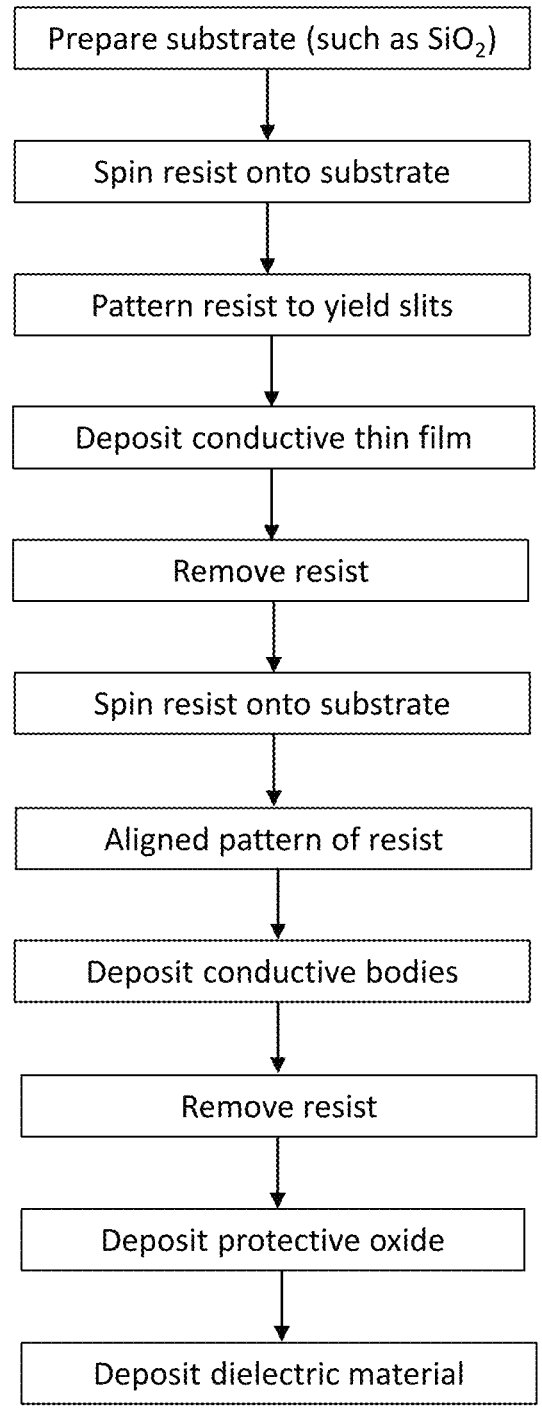
Figure 27:
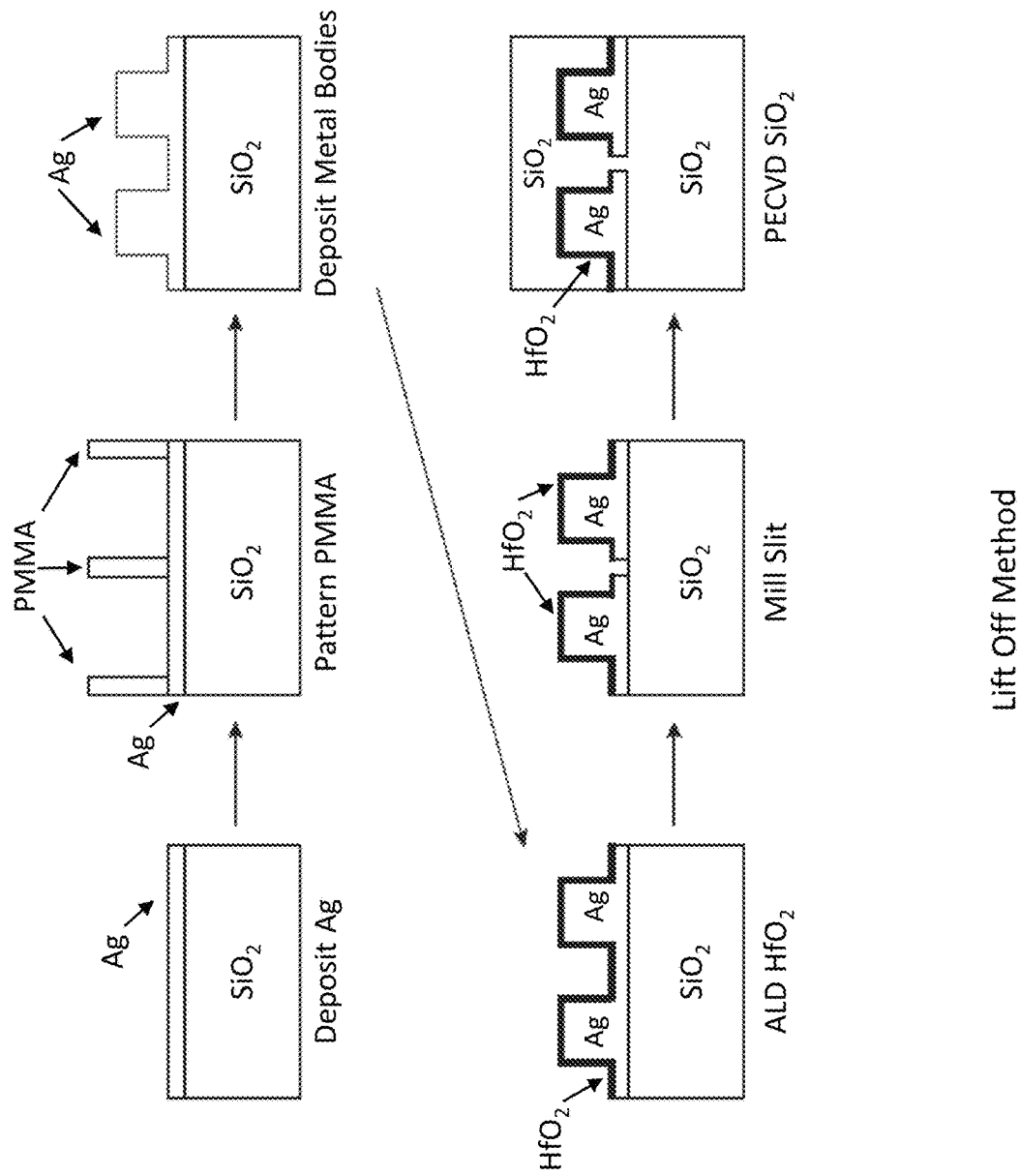
FIG. 27 provides a schematic of a lift-off method for fabricating slit narrowband filters according to embodiments.
Figure 28:
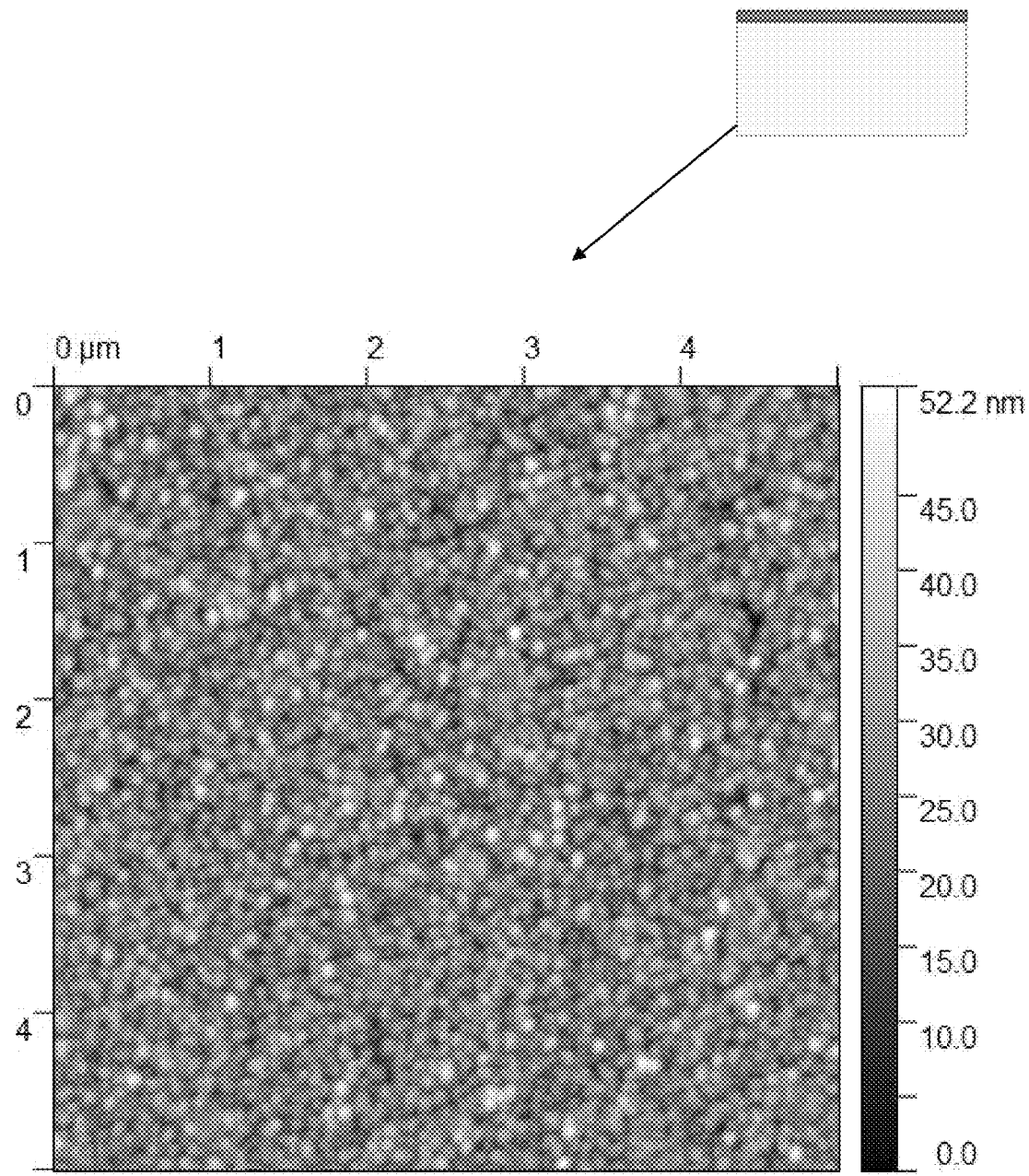
FIGS. 28 to 35 provide images of slit narrowband filters during fabrication using a lift-off method according to embodiments.

A lift-off process for forming a narrowband light filter in accordance with some other embodiments of the invention is set forth in the flow chart in FIG. 26 and the schematic set forth in FIG. 27. As shown in FIG. 26A, in many embodiments of this process, initially, a substrate is prepared, and an electrically conductive thin film is deposited onto the substrate. The substrate is formed of a dielectric material in many embodiments of methods of formation, and a silica substrate ($SiO_2$) is used in some exemplary embodiments. In some other exemplary embodiments, the electrically conductive thin film is Ag or Cu, and according to yet other embodiments, the electrically conductive thin film is deposited in an electron beam evaporator (as shown in the exemplary image set forth in FIG. 28). According to such embodiments of the claimed method, a resist, such as poly(methyl methacrylate) (PMMA), is then deposited on the substrate and prepared for patterning. Patterning of the resist may be done using a lithography method, such as, an electron beam lithography or photolithography system in some embodiments, and in various exemplary embodiments, the patterns that are written in the resist describe the shapes that will eventually be the electrically conductive bodies in the narrowband light filter.

Figure 29A:
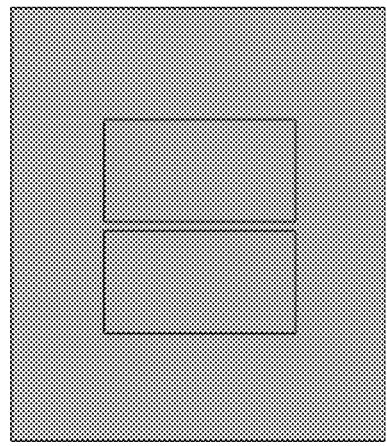
Figure 30A:
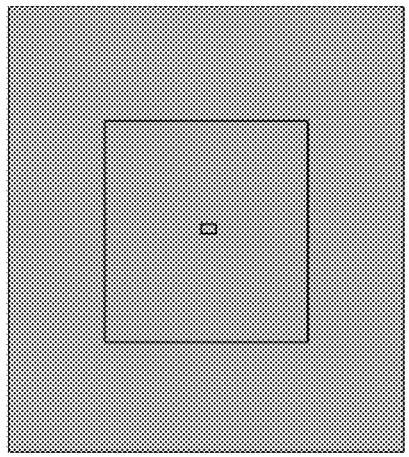
Figure 29B:
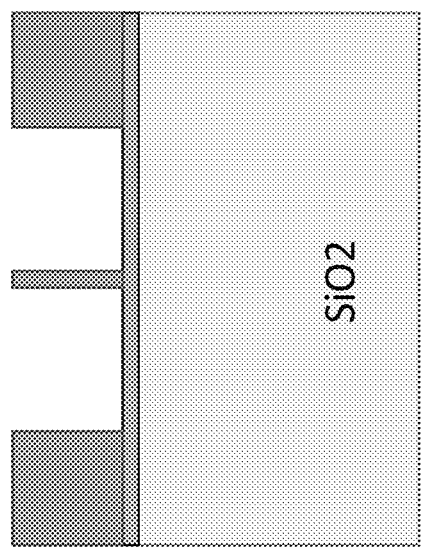
Figure 30B:
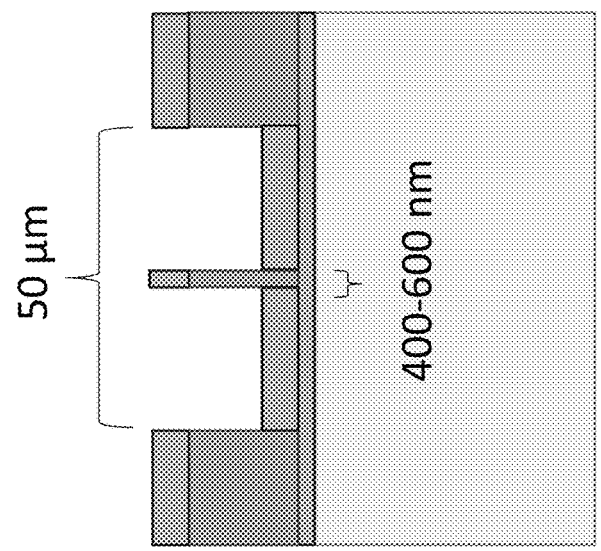
Figure 31:
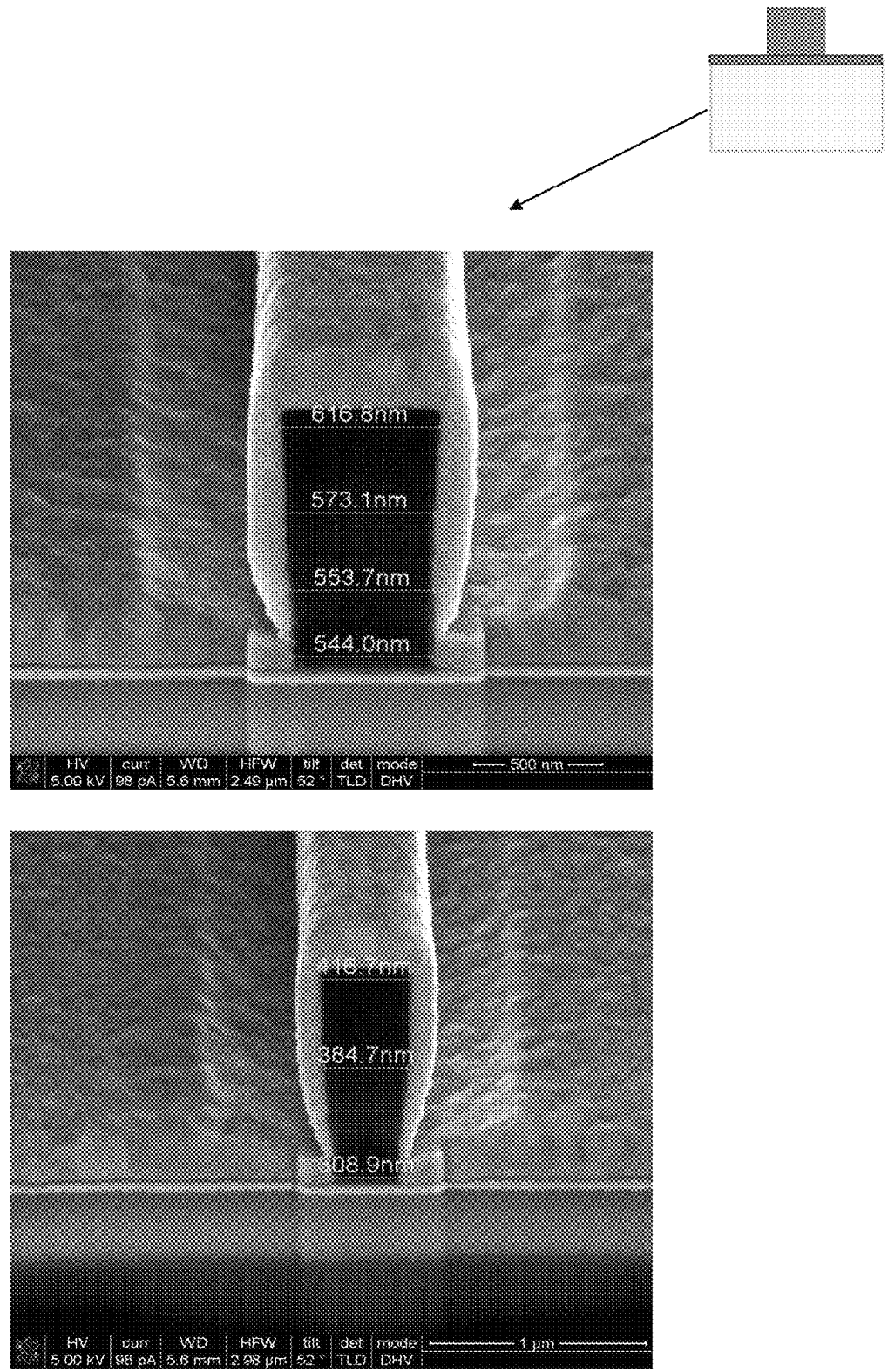
Figure 32:
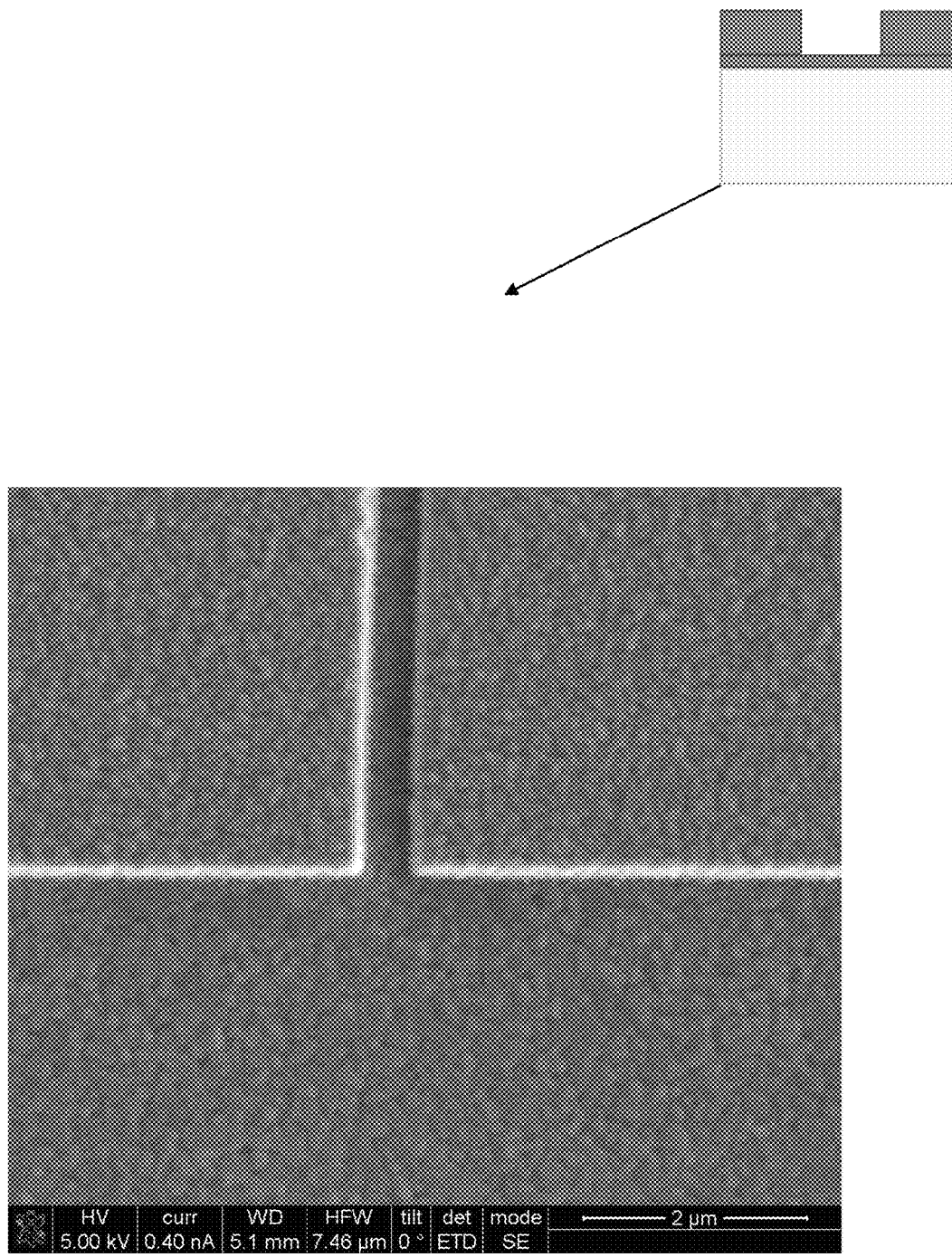
Figure 33:
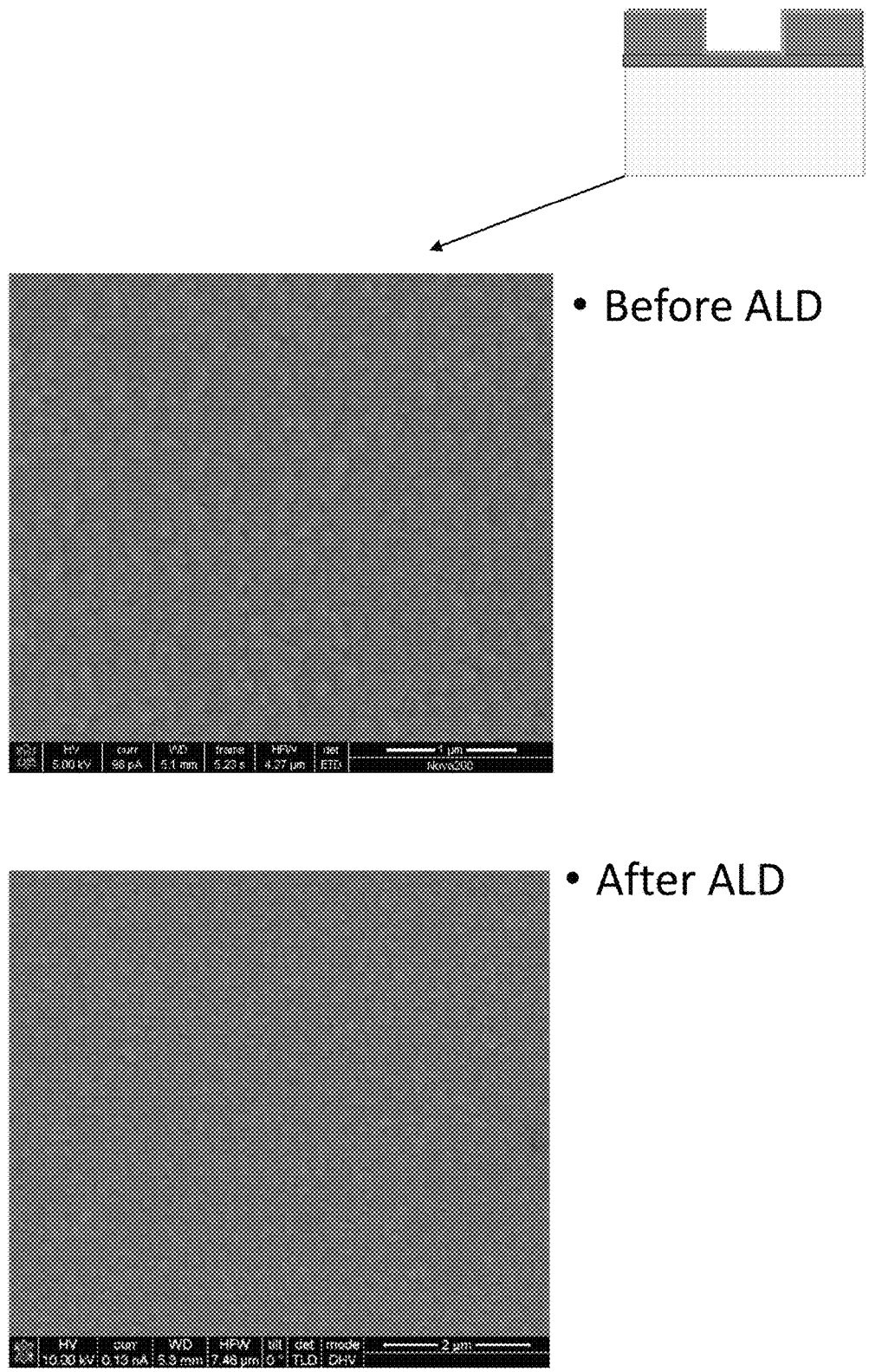
Figure 34:
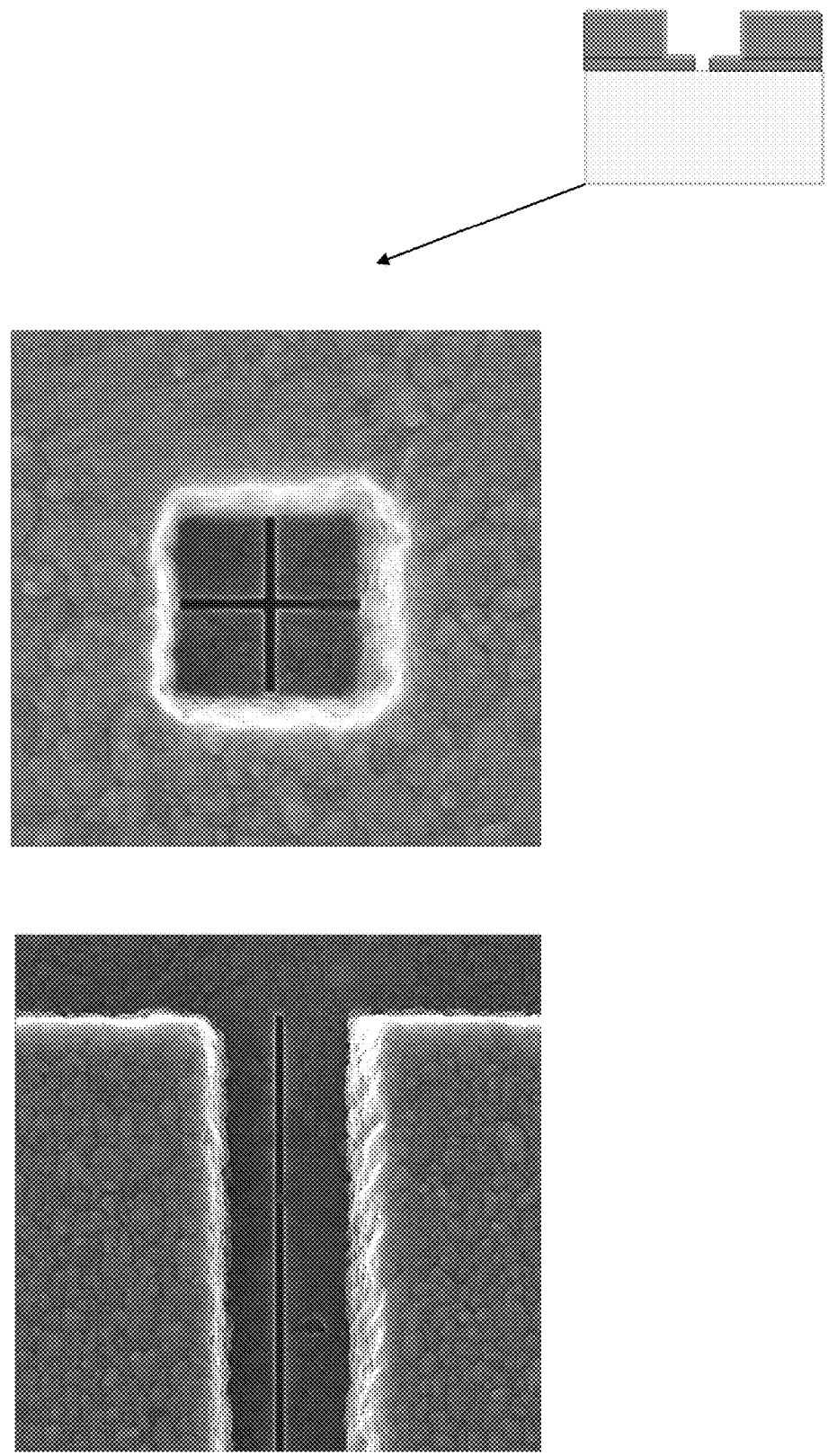
Figure 35:
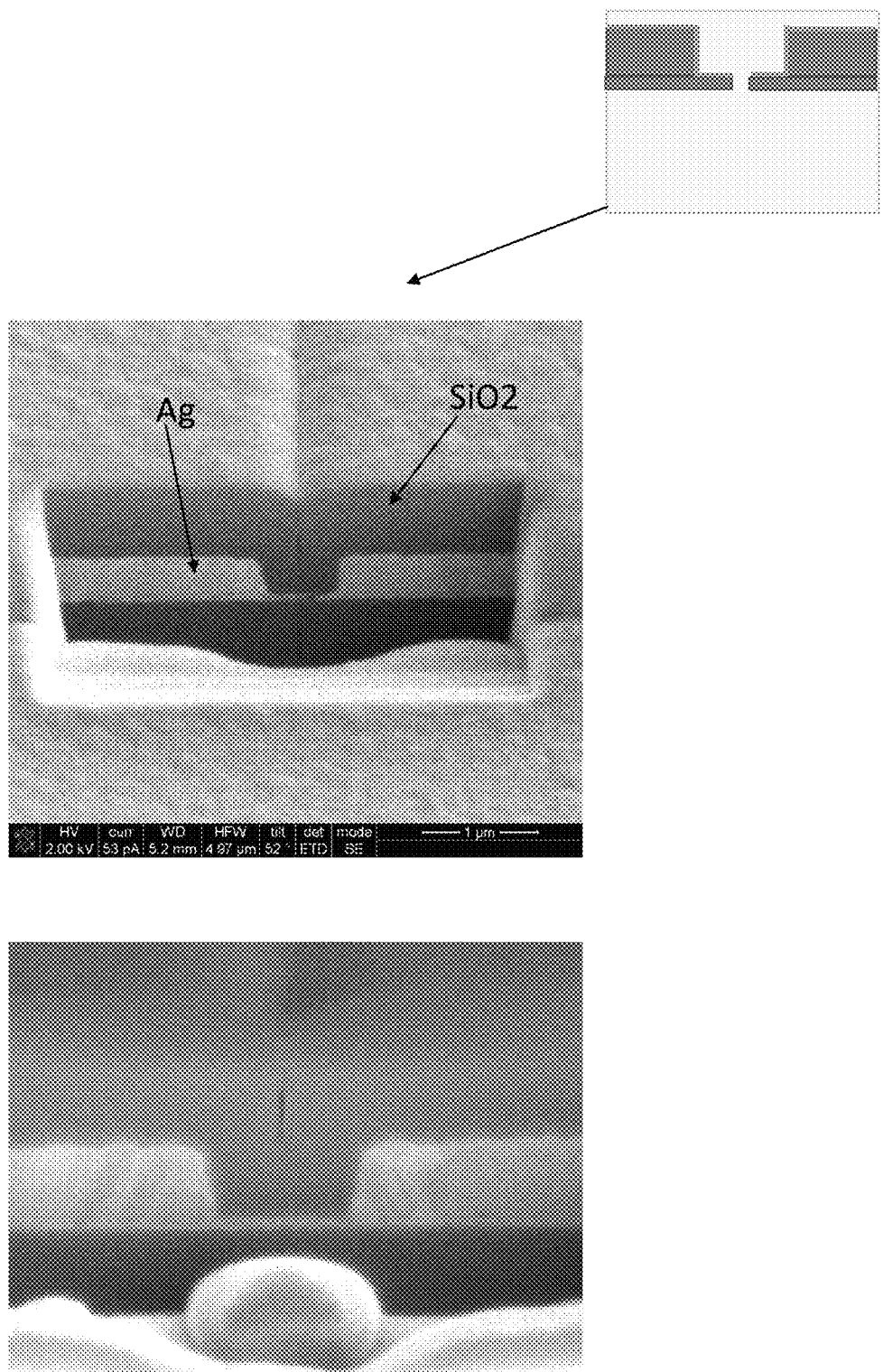

After the resist is patterned, according to many embodiments of the invention, the electrically conductive bodies are deposited on the electrically conductive thin film, and in some such embodiments, the electrically conductive is deposited in an electron beam evaporator. FIG. 29A provides a cross-section schematic for a sample following the resist patterning step with PMMA (an exemplary image of which is provided in FIG. 31). FIG. 29B provides a schematic for a sample cross-section after the electrically conductive bodies have been deposited (but before the removal of the resist material) in accordance with an exemplary embodiment of the invention (an exemplary image of which is provided in FIG. 32). The resist material is then removed, and a protective oxide layer is deposited over the electrically conductive thin film and electrically conductive bodies according to many embodiments of the method. FIGS. 30A and 30B provide schematics illustrating top views following resist removal for a polarization-dependent filter (FIG. 30A) and a polarization-independent filter (FIG. 30B) in accordance with some such embodiments. The schematic of FIG. 30B illustrates an embodiment for a method that will form a narrowband light filter having electrically conductive bodies that are spaced about 400 nm to 600 nm away from each other. In embodiments incorporating a passive oxide layer, an ALD technique may be used to deposit the oxide (such as a $HfO_2$) atop the thin film layer and electrically conductive bodies (an exemplary image of which is provided in FIG. 33). At least one slit is then milled through the electrically conductive thin film and protective oxide layer to expose the substrate in accordance with embodiments of the invention (an exemplary image of which is provided in FIG. 34). The slit, or slits, may milled using a He ion beam in some such embodiments. The process may then be completed by depositing an additional layer of dielectric material, which is $SiO_2$ in various exemplary embodiments. As shown in the exemplary images provided in FIG. 35. The additional dielectric material is deposited over the electrically conductive thin film, electrically conductive bodies, and slit(s) in accordance with embodiments of the invention. Some such embodiments deposit the dielectric material using a PECVD technique.

Modifications to the aforementioned steps and methods may be made to make them scale to commercial production in many embodiments of the invention. For instance, for the imprint method, multiple aligned photolithography writes may be used in some embodiments to produce two dielectric pillars—one to separate the electrically conductive bodies and one to serve as the slit. Additionally, instead of using a plasma etch and pressing, or squishing, to make the thin electrically conductive film layer, a chemical-mechanical polishing system may be used in some other embodiments. Modifications and substitutions may also be made for the lift off method in yet other embodiments. For instance, photolithography can be used instead of electron beam lithography in still other embodiments of the invention. In addition, for some other embodiments, multiple aligned photolithography steps may be used to form the electrically conductive bodies and the slit(s), and ion beam milling is not necessary.

Although the above discussion has focused on specific implementations used to create exemplary embodiments, it will be understood that these processes may be modified and generalized, as shown for example in the flow chart of FIG. 26B. For example, the resist may be spin coated onto the surface of the substrate according to standard methods. Similarly, the resist may be patterned to form the slit via standard lithographic techniques. The electrically conductive thin film can then be deposited and similarly, spin resist patterning and deposition may then be used to form the electrically conductive bodies around the slits. Another layer of electrically conductive material may then be deposited to form the electrically conductive bodies. Following removal of the resist (using any suitable technique) an optional protective oxide may then be deposited followed by the dielectric material, both of which may be deposited according to known methods. Moreover, although one suitable industrial standard fabrication methodology is described in FIG. 26B, it will be understood that any other suitable fabrication technique or set of techniques may be used capable of forming the required features.

It should be understood that the above embodiments and limitations are provided as exemplary; other configurations or materials may be utilized without departing from the scope of the disclosure. Similarly, the above steps are also provided as exemplary; other steps or the order of the steps may be altered (as will be understood) without departing from the scope of the disclosure. A person skilled in the art will recognize that additional embodiments according to the invention are contemplated as being within the scope of the foregoing generic disclosure, and no disclaimer is in any way intended by the foregoing, non-limiting examples.

DOCTRINE OF EQUIVALENTS

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Those skilled in the art will appreciate that the foregoing examples and descriptions of various preferred embodiments of the present invention are merely illustrative of the invention as a whole, and that variations in the components or steps of the present invention may be made within the spirit and scope of the invention. Accordingly, the present invention is not limited to the specific embodiments described herein, but, rather, is defined by the scope of the appended claims.

What is claimed is:

1. A narrowband light filter, comprising:
   at least two electrically conductive bodies having a first thickness;
   an electrically conductive thin film layer disposed between the at least two electrically conductive bodies, the electrically conductive thin film layer having a second thickness wherein the second thickness is less than the first thickness, and the electrically conductive thin film having a first side defining a plane disposed such incident electromagnetic radiation is incident thereon and a second side disposed opposite said first side;
   at least one slit disposed through the electrically conductive thin film layer;
   wherein the electrically conductive thin film layer and electrically conductive bodies are disposed between first and second layers of dielectric material;
   wherein the electrically conductive bodies extend vertically above the plane of the first side of the electrically conductive thin film and reflect the incident electromagnetic radiation onto the electrically conductive thin film;
   wherein a surface of the at least two electrically conductive bodies and a surface of the electrically conductive thin film are coplanar; and
   wherein the electrically conductive bodies and slit are configured in a relative geometry such that a resonance is created in electromagnetic radiation incident thereon such that only electromagnetic radiation of a specific spectral band is passed through the at least one slit.

2. The narrowband light filter of claim 1, wherein the electrically conductive thin film layer and electrically conductive bodies are formed of the same or a different electrically conductive metal.

3. The narrowband light filter of claim 1, further comprising at least one protective oxide layer disposed on at least a surface of the electrically conductive thin film layer and electrically conductive bodies exposed to the incident electromagnetic radiation.

4. The narrowband light filter of claim 3, wherein the at least one protective oxide layer is formed of $HfO_2$ having a thickness of 10 nm or less.

5. The narrowband light filter of claim 1, wherein the dielectric material is $SiO_2$.

6. The narrowband light filter of claim 1, wherein the incident electromagnetic radiation is selected from the group consisting of microwave, infrared, and visible light.

7. The narrowband light filter of claim 3, wherein the electromagnetic radiation is visible light, the dielectric material is $SiO_2$, the at least one protective oxide layer is formed of $HfO_2$, and wherein the electrically conductive thin film layer and electrically conductive bodies are formed of silver.

8. The narrowband light filter of claim 1, wherein the filter comprises a plurality of slits disposed perpendicular to each other such that the narrowband color filter is independent of the polarization of the beam of incident electromagnetic radiation.

9. The narrowband light filter of claim 1, wherein the first thickness is at least 100 nm.

10. The narrowband light filter of claim 1, wherein the second thickness is between 40 nm and 60 nm.

11. The narrowband light filter of claim 1, wherein the at least two electrically conductive bodies are separated by a distance of from 160 to 600 nm.

12. The narrowband light filter of claim 1, wherein the slit has an opening width of at least 10 nm.

13. The narrowband light filter of claim 1, wherein the narrowband light filter has an area of 5 µm² or less.

14. The narrowband light filter of claim 1, wherein the narrowband light filter has an area of 1 µm² or less.

15. An image sensor comprising:
an array of narrowband light filters, each comprising:
  at least two electrically conductive bodies having a first thickness;
  an electrically conductive thin film layer disposed between the at least two electrically conductive bodies, the electrically conductive thin film layer having a second thickness wherein the second thickness is less than the first thickness, and the electrically conductive thin film having a first side defining a plane disposed such incident electromagnetic radiation is incident thereon and a second side disposed opposite said first side;
  at least one slit disposed through the electrically conductive thin layer;
  wherein the electrically conductive thin film layer and electrically conductive bodies are disposed between first and second layers of dielectric material;
  wherein the electrically conductive bodies extend vertically above the plane of the first side of the electrically conductive thin film and reflect the incident electromagnetic radiation onto the electrically conductive thin film;
  wherein a surface of the at least two electrically conductive bodies and a surface of the electrically conductive thin film are coplanar;
  wherein the electrically conductive bodies and slit are configured in a relative geometry such that a resonance is created in electromagnetic radiation incident thereon such that only electromagnetic radiation of a specific spectral band is passed through the at least one slit; and
  wherein each of the narrowband light filters are separated by a distance of at least 50 nm.

16. The image sensor of claim 15, wherein each array is associated with a pixel of the image sensor.

17. The image sensor of claim 16, wherein the pixel is incorporated into a complementary metal-oxide-semiconductor (CMOS) image sensor.

18. The image sensor of claim 16, wherein the image sensor comprises a plurality of pixels each composed of several spectral bands to form a hyperspectral imaging sensor.

* * * * *